United States Patent
Futatsuyama et al.

(10) Patent No.: US 7,352,625 B2
(45) Date of Patent: Apr. 1, 2008

(54) SEMICONDUCTOR MEMORY DEVICE AND MEMORY CARD

(75) Inventors: Takuya Futatsuyama, Yokohama (JP); Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 11/196,445

(22) Filed: Aug. 4, 2005

(65) Prior Publication Data

US 2006/0072359 A1 Apr. 6, 2006

(30) Foreign Application Priority Data

Oct. 1, 2004 (JP) ............................. 2004-290178

(51) Int. Cl.
*G11C 11/34* (2006.01)
(52) U.S. Cl. ............................. 365/185.18; 365/185.17
(58) Field of Classification Search ........... 365/185.17, 365/185.01, 185.18, 63
See application file for complete search history.

(56) References Cited

U.S. PATENT DOCUMENTS

| | | | |
|---|---|---|---|
| 5,469,399 A | 11/1995 | Sato et al. | |
| 6,044,017 A | 3/2000 | Lee et al. | |
| 6,353,242 B1 * | 3/2002 | Watanabe et al. ............ | 257/316 |
| 6,621,735 B2 | 9/2003 | Nakamura et al. | |
| 2002/0159315 A1 * | 10/2002 | Noguchi et al. ............. | 365/200 |
| 2003/0051093 A1 * | 3/2003 | Takeuchi ..................... | 711/103 |
| 2003/0095448 A1 * | 5/2003 | Ichige et al. ................. | 365/200 |
| 2004/0062077 A1 * | 4/2004 | Tanaka ..................... | 365/185.08 |
| 2004/0152262 A1 * | 8/2004 | Ichige et al. ................. | 438/257 |
| 2006/0072359 A1 | 4/2006 | Futatsuyama et al. | |

FOREIGN PATENT DOCUMENTS

JP 2002-63795 2/2002

OTHER PUBLICATIONS

U.S. Appl. No. 11/495,463, filed Jul. 31, 2006, Futatsuyama.
U.S. Appl. No. 11/558,714, filed Nov. 10, 2006, Iwai et al.

* cited by examiner

*Primary Examiner*—Richard T. Elms
*Assistant Examiner*—Douglas King
(74) *Attorney, Agent, or Firm*—Oblon, Spivak, McClelland, Maier & Neustadt, P.C.

(57) ABSTRACT

A semiconductor memory device disclosed herein includes: a first select gate line, a gate electrode of a first select transistor connected to the first select gate line; a second select gate line, a gate electrode of a second select transistor connected to the second select gate line; and word lines between the first select gate line and the second select gate line, gate electrodes of memory cells being respectively connected to the word lines, wherein when data in a memory cell connected to a first adjacent word line which is adjacent to the first select gate line is read, a voltage of the second select gate line is increased after a voltage of the first select gate line is increased, and when data in a memory cell connected to a second adjacent word line adjacent to the second select gate line is read, the voltage of the first select gate line is increased after the voltage of the second gate line is increased.

19 Claims, 23 Drawing Sheets

SEMICONDUCTOR MEMORY DEVICE AND MEMORY CARD

CROSS REFERENCE TO RELATED APPLICATION

This application claims benefit of priority under 35 U.S.C. §119 to Japanese Patent Application No. 2004-290178, filed on Oct. 1, 2004, the entire contents of which are incorporated by reference herein.

BACKGROUND OF THE INVENTION

1. Field of the Invention

The present invention relates to a semiconductor memory device and a memory card, and particularly relates to a semiconductor memory device in which a modification is made to the order of supply of signals to select gate lines when data in a memory cell connected to a word line is read and a memory card equipped with such a semiconductor memory device.

2. Related Background Art

Among semiconductor memory devices, a nonvolatile semiconductor memory device which holds stored data in a nonvolatile manner is in widespread use. Some of these nonvolatile semiconductor memory devices have a memory cell array structure, for example, called a NAND type.

The NAND-type memory cell array is composed of plural NAND cell units each including plural memory cells connected in series in such a manner as to share a source/drain region, a drain-side select transistor connected on the drain side of these plural memory cells, and a source-side select transistor connected on the source side of these plural memory cells.

Further, in the memory cell array, plural word lines are provided in parallel and each connect gate electrodes of memory cells arranged in a word line direction in common. Furthermore, respective gate electrodes of drain-side select transistors arranged in the word line direction are connected in common by a drain-side select gate line, and respective gate electrodes of source-side select transistors arranged in the word line direction are connected in common by a source-side select gate line. Plural bit lines are provided in parallel in a direction crossing the word line direction, and each bit line is connected to its corresponding NAND cell unit via the drain-side select transistor.

In such a NAND-type nonvolatile semiconductor memory device, the operation when data is read from a memory cell is performed, for example, in the following manner. First, the voltage of the drain-side select gate line is increased from 0 V to approximately 4 V. Subsequently, a voltage of approximately 1 V is supplied to the bit line.

Then, a read voltage is supplied to a word line (selected word line) connected to the memory cell from which the data is to be read, and a voltage of approximately 4 V is supplied to the other word lines (non-selected word lines). Subsequently, the voltage of the source-side select gate line is increased from 0 V to approximately 4 V.

Thereafter, by detecting a potential change in the bit line, it is determined whether "0" data or "1" data is stored in the memory cell to be read. More specifically, for example, it is suitable to previously define a state in which electrons are injected into a floating gate and the threshold of the memory cell is high as the "0" data, and contrary to this, define a state in which electrons are extracted from the floating gate and the threshold of the memory cell is low as the "1" data.

The voltages are applied to the word lines, the drain-side select gate line, the source-side select gate line, and the bit line in the aforementioned timing, and as a prior application in which this timing is changed, Japanese Patent Application No. 2003-315782 exists.

SUMMARY OF THE INVENTION

In order to accomplish the aforementioned and other objects, according to one aspect of the present invention, a semiconductor memory device, comprises:

a first select gate line which is provided along a first direction, a gate electrode of a first select transistor being connected to the first select gate line;

a second select gate line which is provided along the first direction, a gate electrode of a second select transistor being connected to the second select gate line; and a plurality of word lines which are provided between the first select gate line and the second select gate line along the first direction, gate electrodes of memory cells being respectively connected to the word lines, wherein when data in a memory cell connected to a first adjacent word line which is a word line adjacent to the first select gate line is read, a voltage of the second select gate line is increased after a voltage of the first select gate line is increased, and when data in a memory cell connected to a second adjacent word line which is a word line adjacent to the second select gate line is read, the voltage of the first select gate line is increased after the voltage of the second gate line is increased.

According to another aspect of the present invention, a semiconductor memory device, comprises:

a plurality of word lines which are provided along a first direction gate electrodes of memory cells being respectively connected to the word lines;

a first select gate line which is provided along the first direction, a gate electrode of a first select transistor being connected to the first select gate; and a second select gate line which is provided along the first direction, a gate electrode of a second select transistor being connected to the second select gate, and the second select gate being provided on a side opposite to a first adjacent word line which is a word line adjacent to the fist select gate line with the first select gate line therebetween, wherein when data in the memory cell is read, a voltage of the second select gate line is increased after a voltage of the first select gate line is increased.

According to another aspect of the present invention, a memory card includes a semiconductor memory device, wherein the semiconductor memory device comprises:

a first select gate line which is provided along a first direction, a gate electrode of a first select transistor being connected to the first select gate;

a second select gate line which is provided along the first direction, a gate electrode of a second select transistor being connected to second select gate; and a plurality of word lines which are provided between the first select gate line and the second select gate line along the first direction, gate electrodes of memory cells being respectively connected to the word lines, wherein when data in a memory cell connected to a first adjacent word line which is a word line adjacent to the first select gate line is read, a voltage of the second select gate line is increased after a voltage of the first select gate line is increased, and when data in a memory cell connected to a second adjacent word line which is a word line adjacent to the second select gate line is read, the voltage of the first select gate line is increased after the voltage of the second gate line is increased.

According to another aspect of the present invention, a memory includes a semiconductor memory device, wherein the semiconductor memory device comprises:

a plurality of word lines which are provided along a first direction, gate electrodes of memory cells being respectively connected to the word lines;

a first select gate line which is provided along the first direction, a gate electrode of a first select transistor being connected to the first select gate; and a second select gate line which is provided along the first direction, a gate electrode of a second select transistor being connected to the second select gate line, and the second select gate line is provided on a side opposite to a first adjacent select gate line which is a word line adjacent to the fist select gate line with the first select gate line therebetween, wherein when data in the memory cell is read, a voltage of the second select gate line is increased after a voltage of the first select gate line is increased.

DETAILED DESCRIPTION OF THE EMBODIMENTS

[Basic Technique]

Figure 1:
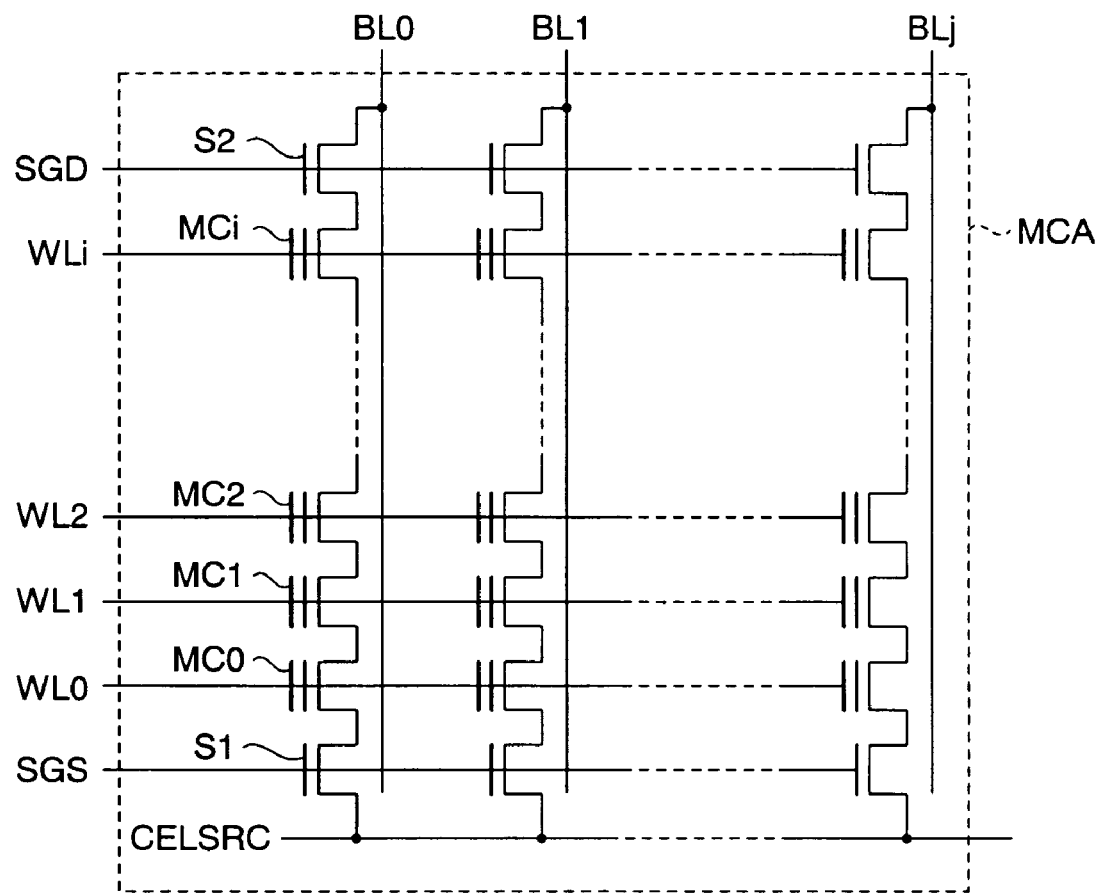
FIG. 1 is a diagram showing the configuration of a memory cell array in a nonvolatile semiconductor memory device according to a basic technique and a first embodiment.
Figure 2:
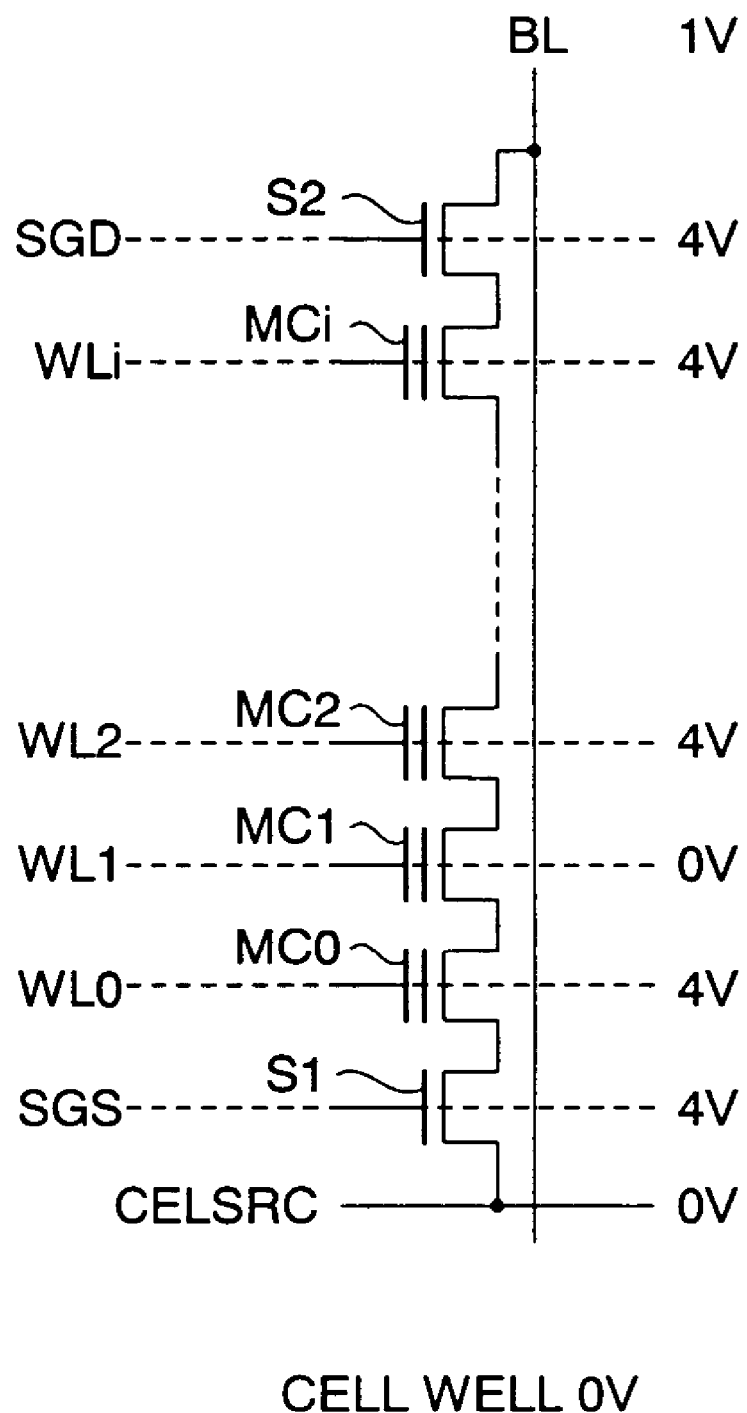
FIG. 2 is a diagram showing the configuration of one NAND cell unit in the memory cell array in FIG. 1.

FIG. 1 is a diagram showing the configuration of a memory cell array MCA in a NAND-type nonvolatile semiconductor memory device, and FIG. 2 is a diagram showing the configuration of one NAND cell unit.

As shown in FIG. 2, in the NAND cell unit, plural memory cells MC0 to MCi are connected in series in such a manner as to share a source/drain region. A source-side select transistor S1 is connected to the source side of the memory cell MC0, and the NAND cell unit is connected to a cell source line CELSRC via this source-side select transistor S1.

A drain-side select transistor S2 is connected to the drain side of the memory cell MCi, and the NAND cell unit is connected to a bit line BL via this drain-side select transistor S2. By this configuration, a current path from a bit line BL to the cell source line CELSRC through the drain-side select transistor S2, the memory cell MCi, . . . , the memory cell MC0, and the source-side select transistor S1 is formed.

As shown in FIG. 1, the memory cell array MCA is configured by providing a plurality of NAND cell units such as described above. More specifically, in the memory cell array MCA, plural word lines WL0 to WLi are provided in parallel, and the respective word lines WL0 to WLi connect gate electrodes of the memory cells MC0 to MCi arranged in a word line direction in common. A source-side select gate line SGS is provided in parallel with these word lines WL0 to WLi and connects gate electrodes of the source-side select transistors S1 arranged in the word line direction in common. Further, a drain-side select gate line SGD is provided in parallel with the word lines WL0 to Wli on the side opposite to the source-side select gate line SGS with the word lines WL0 to WLi therebetween, and connects gate electrodes of the drain-side select transistors S2 arranged in the word line direction in common.

Furthermore, plural bit lines BL0 to BLj are provided in parallel in a bit line direction which is a direction crossing the word line direction. Each of the bit lines BL0 to BLj is connected to a drain of the drain-side select transistor S2 in its corresponding NAND cell unit.

In the basic technique explained here, the word line direction is defined as a first direction, the bit line direction is defined as a second direction, a source-side select gate line SGS is defined as a first select gate line, the source-side select transistor S1 is defined as a first select transistor, the drain-side select gate line SGD is defined as a second select gate line, and the drain-side select transistor S2 is defined as a second select transistor.

Figure 3:
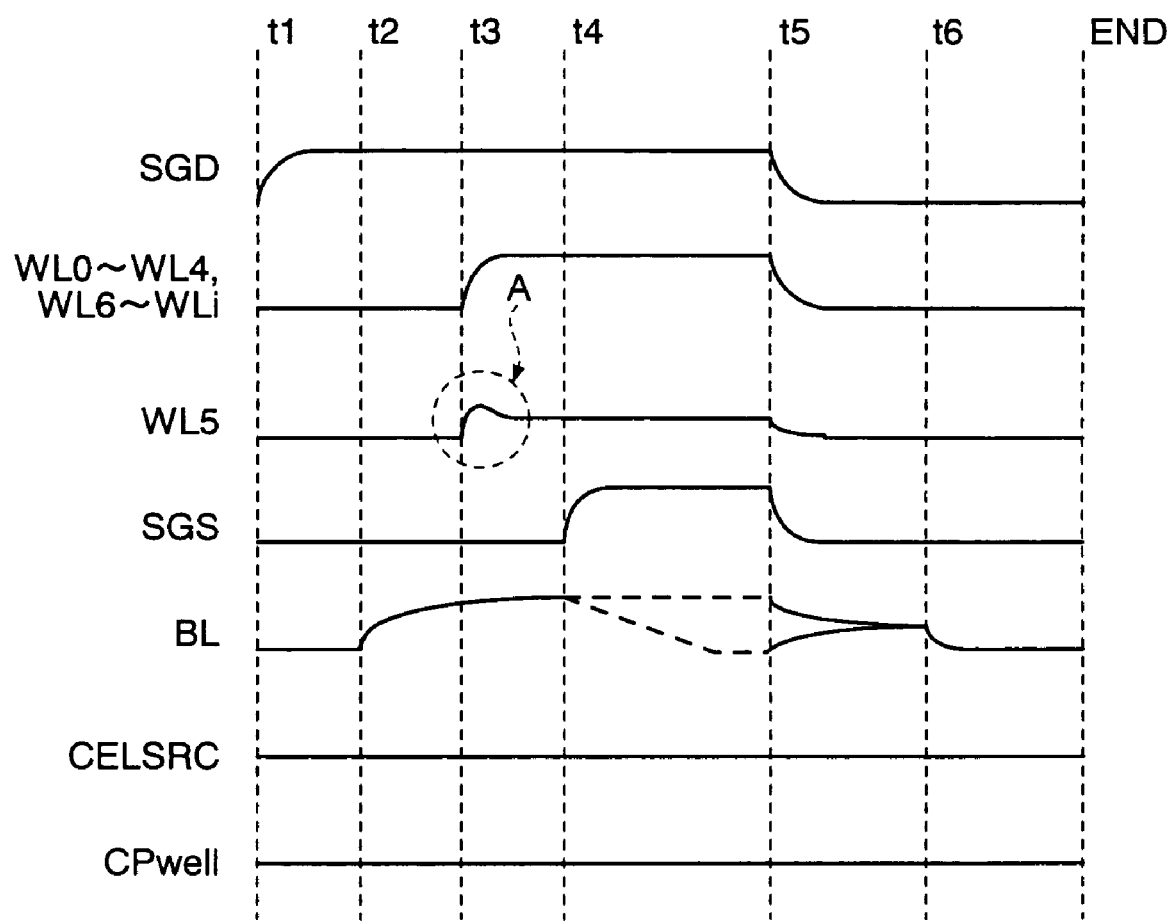
FIG. 3 is a timing chart when data in a memory cell is read in the basic technique (when data in a memory cell connected to an inner word line is read)

Next, the operation of reading data from the aforementioned memory cell array MCA will be explained. FIG. 3 is a timing chart when data in the memory cell MC5 is read. As shown in FIG. 3, first, at a point in time t1, the voltage of the drain-side select gate line SGD is increased from 0 V to approximately 4 V. Subsequently, at a point in time t2, a voltage of approximately 1 V is supplied to the bit line BL0.

Then, at a point in time t3, predetermined voltages are supplied to the word lines WL0 to Wli. More specifically, a read voltage is supplied to the word line (hereinafter referred to as the selected word line) WL5 connected to the memory cell MC5 to be read, and a voltage of approximately 4 V is supplied to the word lines (hereinafter referred to as the non-selected word lines) WL0 to WL4 and WL6 to WLi to which the other memory cells are connected. Thereafter, at a point in time t4, the voltage of the source-side select gate line SGS is increased from 0 V to approximately 4 V.

In the non-volatile memory cell MC, for example, a state in which electrons are injected into a floating gate of the memory cell and the threshold of the memory cell MC5 is high is defined as "0" data, whereas a state in which electrons are extracted from the floating gate and the threshold of the memory cell MC5 is low is defined as "1" data. Accordingly, if the memory cell to be read has the "1" data when a desired voltage is applied to a selected word line, the NAND unit cell thereof is brought into conduction from the bit line BL to the cell source line CELSRC, whereby the voltage of the bit line BL drops. If the memory cell to be read has the "0" data, the NAND cell unit thereof is not brought into conduction, whereby the voltage of the bit line BL does not drop. As just described, the voltage of the bit line BL changes depending on data in the cell, and hence data in the memory cell can be read according to whether or not the voltage of the bit line BL drops.

After this read operation is completed, at a point in time t5, the voltages of the drain-side select gate line SGD, the word lines WL0 to WLi, and the source-side select gate line SGS are discharged to 0 V, and all the bit lines BL0 to BLj are equalized in voltage. At a point in time t6, the bit lines BL0 to BLj which have become the same potential are discharged to 0 V.

Figure 4:
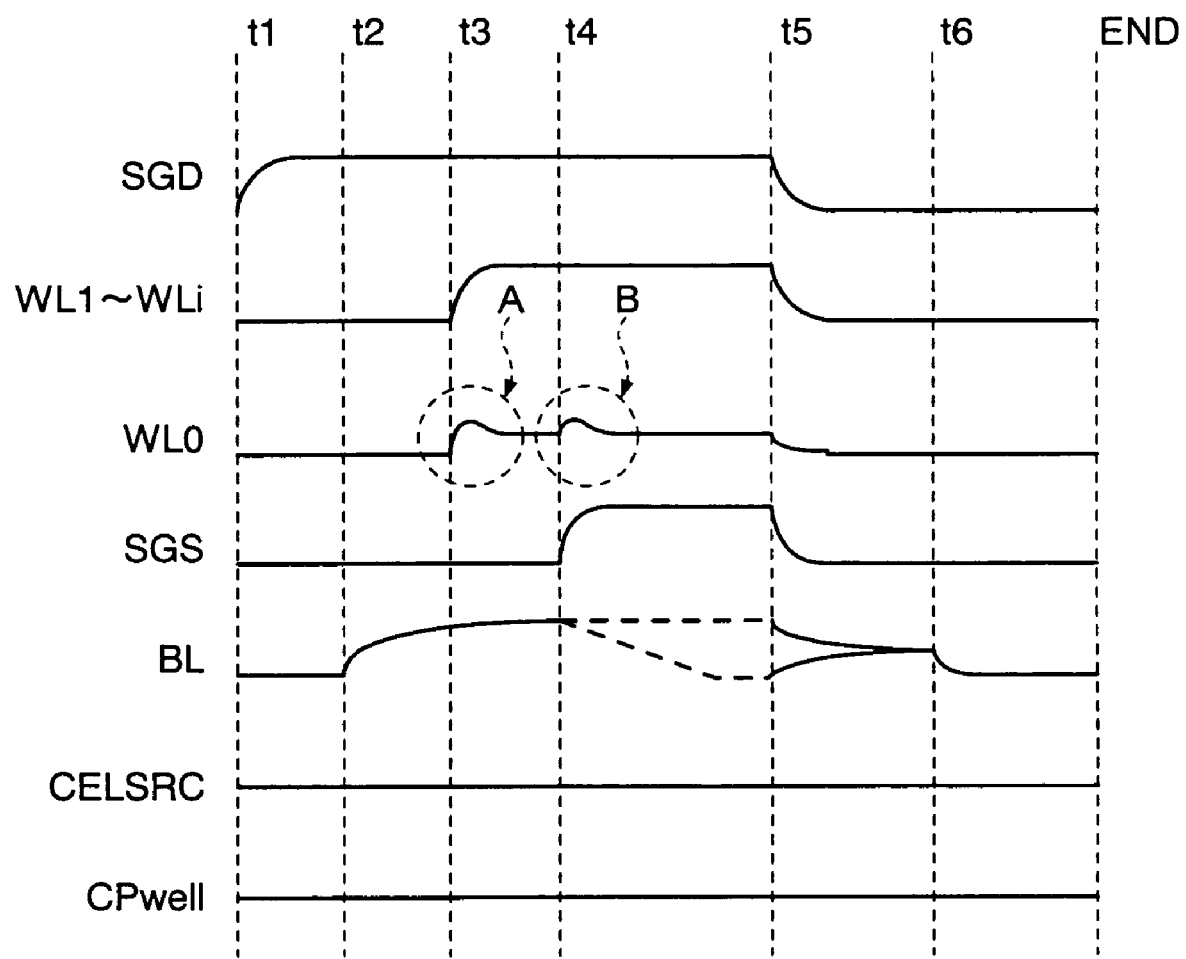
FIG. 4 is a timing chart when data in a memory cell is read in the basic technique (when data in a memory cell connected to a word line adjacent to a source-side select gate line is read)

FIG. 4 is a timing chart when data in the memory cell MC0 is read. As can be seen from FIG. 4, the basic voltage application timing is the same as that in the case of the memory cell MC5, but different in that as concerns voltages supplied to the word lines WL0 to WLi at the point in time t3, the read voltage is supplied to the selected word line WL0 and the voltage of approximately 4 V is supplied to the non-selected word lines WL1 to WLi.

In the aforementioned read operation, coupling noise such as shown by the arrow A in FIG. 3 and FIG. 4 and coupling noise such as shown by the arrow B in FIG. 4 occur. Namely, as shown by the arrow A in FIG. 3 and FIG. 4, the selected word line overshoots to a voltage higher than a predetermined read voltage due to coupling noise with its adjacent non-selected word lines, and thereby needs to wait for the next operation until it returns to a target voltage. Moreover, as shown by the arrow B in FIG. 4, when the word line WL0 is the selected word line, the word line WL0 is adjacent to the source-side select gate line SGS. Hence, if the voltage of the source-side select gate line SGS is increased, the word line WL0 similarly overshoots by receiving coupling noise. Besides, at the point in time t4, the drain-side select transistor S2 is also brought into conduction. Hence, if the memory cell MC0 is brought into conduction by receiving coupling noise, bit line discharge occurs when data to be read is the "1" data, which is undesirable.

Namely, in a state where a voltage higher than the desired voltage is applied to the selected word line WL0, discharge of the bit line BL is started. As a result, the threshold voltage of the memory cell MC0 appears to be lower than an intended value. With the advance of microfabrication, a gate wire material used for the word lines WL0 to WLi and the select gate lines SGS and SGD requires a reduction in resistance, whereby a reduction in film thickness becomes more difficult, a space between gate wires becomes narrower, and coupling noise between gate wires becomes larger. Moreover, from the view point of reliability and durability of the memory cell MC, a reduction in the film thickness of a tunnel insulating film of the memory cell MC becomes more difficult, thereby a capacitance between wires forms an increasing proportion of capacitances of the word lines WL0 to WLi and the select gate lines SGS and SGD, and consequently, the coupling noise between gate wires becomes increasingly larger.

Figure 5:
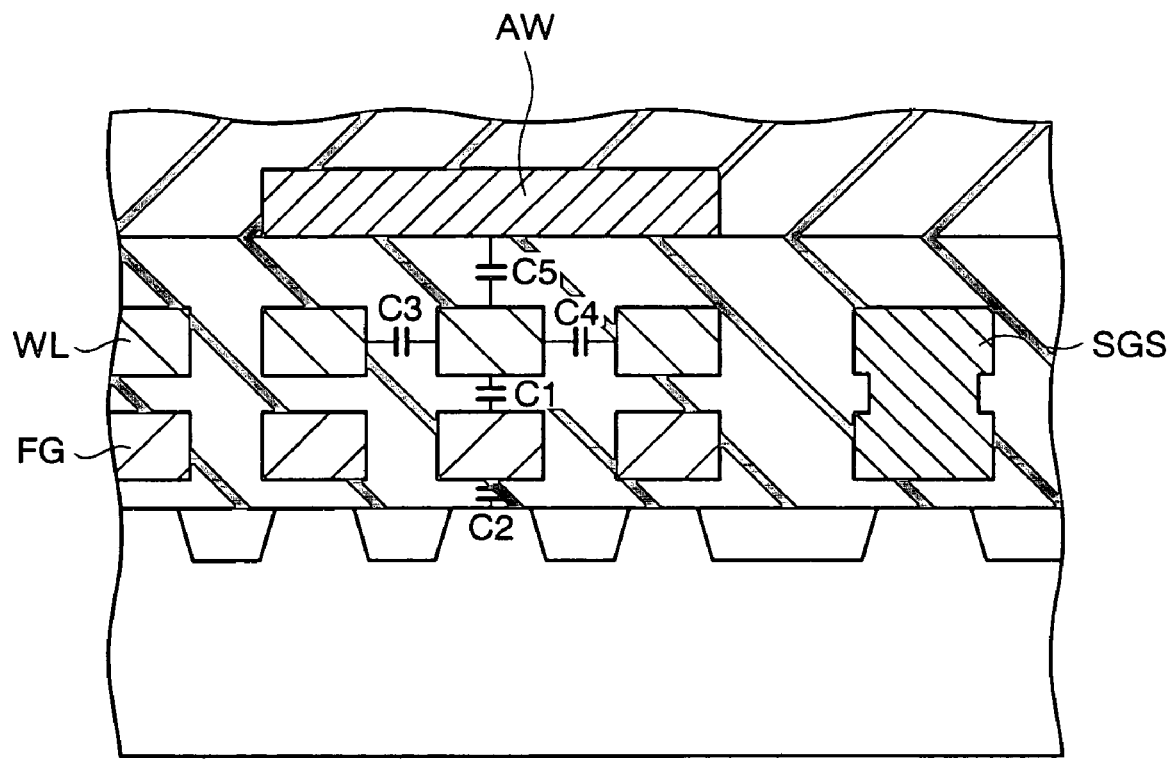
FIG. 5 is a partial sectional view of the NAND cell unit.

A detailed explanation above will be given using FIG. 5 which is a partial sectional view of the NAND cell unit. Various capacitances occur between the word line WL and its adjacent wires. As main capacitances, a capacitance C1 between the word line WL and a floating gate FG, a capacitance C2 between the floating gate FG and a substrate in which a channel is formed or a well, capacitances C3 and C4 between the adjacent word lines WL and WL, and the source-side select gate line SGS exist. Additionally, when an auxiliary wire AW of the drain-side select gate line SGD or the source-side select gate line SGS exists, a capacitance C5 between the word line WL and the auxiliary wire AW exists.

Generally, a capacitance C is expressed by $C=\epsilon(S/d)$. Here, $\epsilon$ is a relative dielectric constant, S is the area of an electrode, and d is the distance between electrodes. Accordingly, when the distance between gate wires becomes shorter with the advance of microfabrication, it means that the distance d becomes shorter, and thereby the capacitance C increases. Moreover, when a thickness h of a gate wire is increased to reduce the resistance of the gate wire, it means that the area S becomes larger, and thereby the capacitance C also increases.

The study conducted by the inventor shows that when h/d becomes larger than 1.8, the influence of the coupling noise between gate wires starts to appear. In particular, for example, if the distance becomes 71 nm when h=200 nm, the coupling noise remarkably appears, and h/d in this case becomes approximately 2.82. If the distance becomes 55 nm when h=200 nm, h/d becomes approximately 3.64.

In the following respective embodiments, when data in the memory cell MC is read as described above, the coupling noise from the source-side select gate line SGS does not exert a bad influence on a data read operation.

First Embodiment

Figure 6:
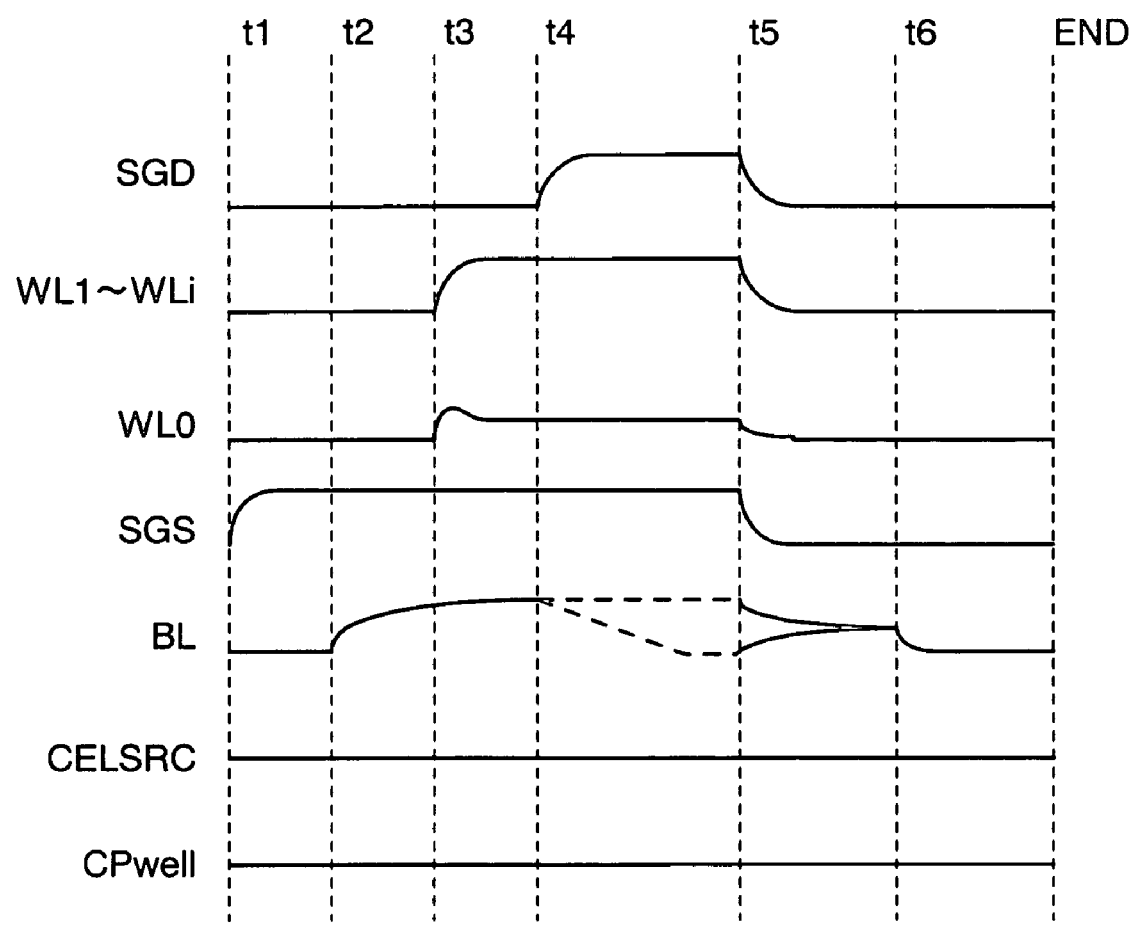
FIG. 6 is a timing chart when data in a memory cell is read in the first embodiment (when data in the memory cell connected to a word line adjacent to a source-side select gate line is read)

FIG. 6 is a timing chart when data in the memory cell MC0 connected to the word line WL0 is read in a nonvolatile semiconductor memory device according to this embodiment. Incidentally, this word line WL0 corresponds to a first adjacent word line which is a word line adjacent to a first select gate line (SGS) in this embodiment.

As shown in FIG. 6, when the data in the memory cell MC0 is read, first, at the point in time t1, the voltage of the source-side select gate line SGS is increased from 0 V to approximately 4 V. Subsequently, at the point in time t2, a voltage of approximately 1 V is supplied to the bit line BL.

Then, at the point in time t3, predetermined voltages are supplied to the word lines WL0 to WLi. More specifically, a read voltage is supplied to the selected word line WL0 connected to the memory cell MC0 to be read, and a voltage of approximately 4 V is supplied to the non-selected word lines WL1 to WLi to which the other memory cells are connected. Thereafter, at the point in time t4, the voltage of the drain-side select gate line SGD is increased from 0 V to approximately 4 V. Then, the data in the memory cell is read according to whether or not the voltage of the bit line BL drops.

After this read operation is completed, at the point in time t5, the voltages of the drain-side select gate line SGD, the word lines WL0 to WLi, and the source-side select gate line SGS are discharged to 0 V, and all the bit lines BL0 to BLj are equalized in voltage. At the point in time t6, the bit lines BL0 to BLj which have become the same potential are discharged to 0 V.

Incidentally, it is defined here that the voltage supply order shown in FIG. 6 is called a backward voltage supply order.

Figure 7:
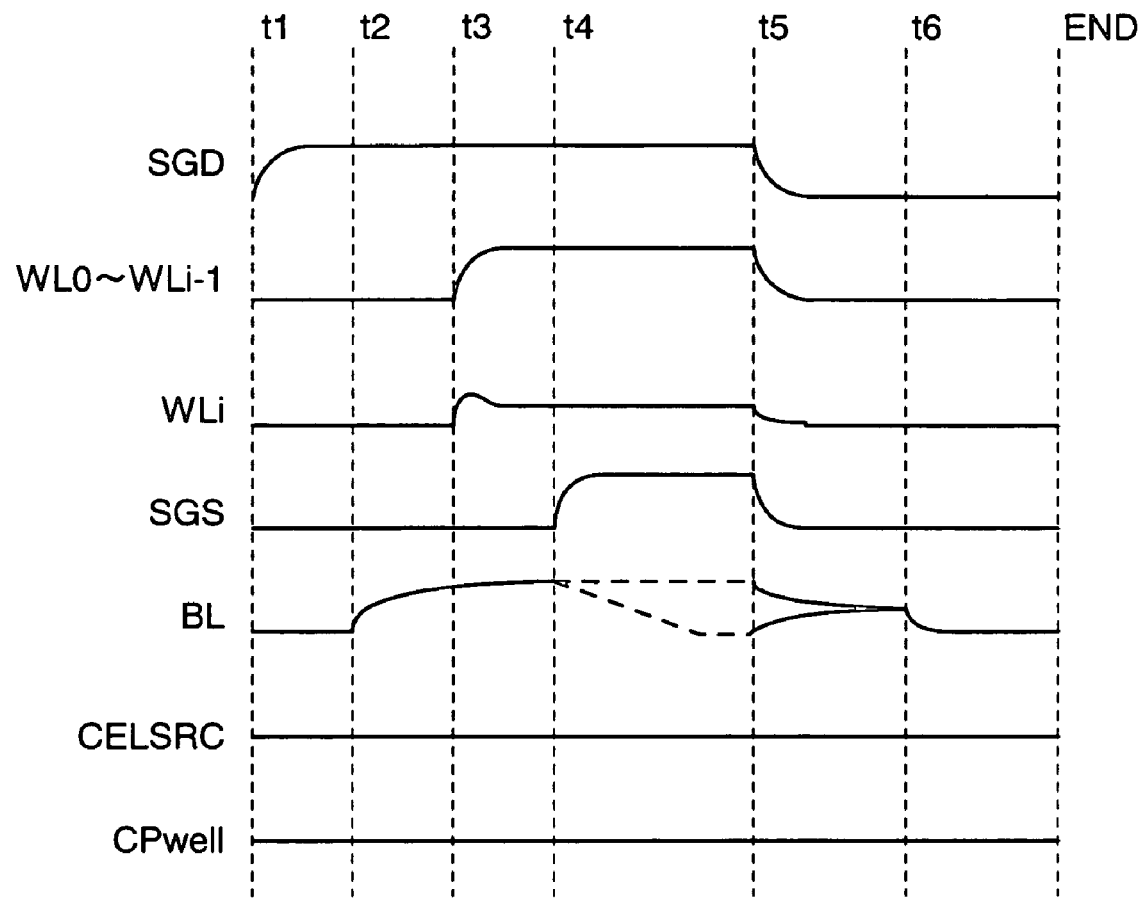
FIG. 7 is a timing chart when data in a memory cell is read in the first embodiment (when data in a memory cell connected to a word line adjacent to a drain-side select gate line is read)

FIG. 7 is a timing chart when data in the memory cell MCi connected to the word line WLi is read in the nonvolatile semiconductor memory device according to this embodiment. Incidentally, the word line WLi corresponds to a second adjacent word line which is a word line adjacent to a second select gate line (SGD) in this embodiment.

As shown in FIG. 7, when the data in the memory cell MCi is read, first, at the point in time t1, the voltage of the drain-side select gate line SGD is increased from 0 V to approximately 4 V. Subsequently, at the point in time t2, the voltage of approximately 1 V is supplied to the bit line BL.

Then, at the point in time t3, the predetermined voltages are supplied to the word lines WL0 to WLi. More specifically, the read voltage is supplied to the selected word line WLi connected to the memory cell MCi to be read, and the voltage of approximately 4 V is supplied to the non-selected word lines WL0 to WLi-1 to which the other memory cells are connected. Thereafter, at the point in time t4, the voltage of the source-side select gate line SGS is increased from 0 V to approximately 4 V. Then, the data in the memory cell is read according to whether or not the voltage of the bit line BL drops.

After this read operation is completed, at the point in time t5, the voltages of the drain-side select gate line SGD, the word lines WL0 to WLi, and the source-side select gate line SGS are discharged to 0 V, and all the bit lines BL0 to BLj are equalized in voltage. At the point in time t6, the bit lines BL0 to BLj which have become the same potential are discharged to 0 V.

Incidentally, it is defined here that the voltage supply order shown in FIG. 7 is called a forward voltage supply order. This forward voltage supply order is the same as the voltage supply order in FIG. 3 explained in the basic technique.

Figure 8:
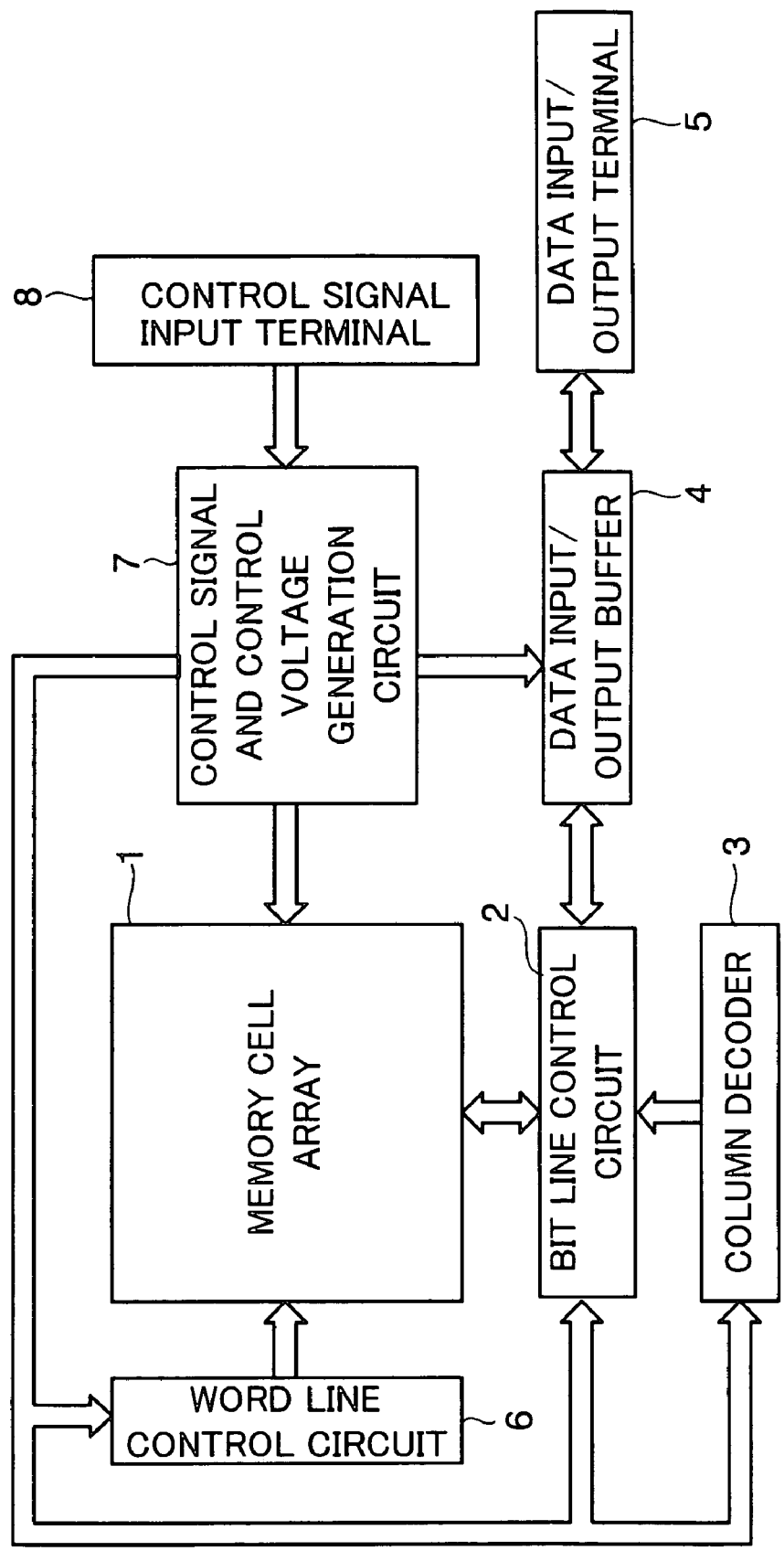
FIG. 8 is a block diagram for explaining the overall configuration of the nonvolatile semiconductor memory device according to the first embodiment.

FIG. 8 is a block diagram for explaining the overall configuration of the nonvolatile semiconductor memory device according to this embodiment. As shown in FIG. 8, the nonvolatile semiconductor memory device according to this embodiment includes a memory cell array 1, a bit line control circuit 2, a column decoder 3, a data input/output buffer 4, a data input/output terminal 5, a word line control circuit 6, a control signal and control voltage generation circuit 7, and a control signal input terminal 8.

In the memory cell array 1, a plurality of memory cell arrays MCA shown in FIG. 1 are arranged. The bit line control circuit 2 is a circuit to control the bit lines BL0 to BLj, and as described above, it supplies a voltage to the bit lines BL0 to BLj and detects a voltage change in the bit lines BL0 to BLj to determine data. The column decoder 3 selects one bit line from the bit lines BL0 to BLj based on a column address. When data is read from the memory cell MC, data of the one bit line selected from the bit line BL0 to BLj is output from the data input/output terminal 5 via the data input/output buffer 4.

The word line control circuit 6 is a circuit to control the word lines WL0 to WLi, the select gate lines SGS and SGD, a cell source line CELSRC, and a cell well CPwell. Namely, as described above, the word line control circuit 6 supplies voltages to the word lines WL0 to WLi and the select gate lines SGS to SGD to perform the read operation in the forward voltage supply order or perform the read operation in the backward voltage supply order. Moreover, the word line control circuit 6 maintains the cell source line CELSRC and the cell well CPwell at 0 V during the read operation.

The control signal and control voltage generation circuit 7 supplies various control signals and control voltages to respective portions in response to the input of a control signal from the control signal input terminal 8. For example, in the read operation, the control signal and control voltage generation circuit 7 supplies a column address to the column decoder 3 and a row address to the word line control circuit 6. The control signal and control voltage generation circuit 7 further supplies the aforementioned voltage of 0 V, voltage of 4 V, and read voltage, for example, required for the aforementioned operations to the word line control circuit 6, the bit line control circuit 2, and so on.

As described above, according to the nonvolatile semiconductor memory device of this embodiment, when the data in the memory cell connected to the word line WL0 adjacent to the source-side select gate line SGS is read, the voltage of the drain-side select gate line SGD is increased after the voltage of the source-side select gate line SGS is increased. This can prevent the voltage of the word line WL0 connected to the memory cell MC0 from overshooting due to the coupling noise from the source-side select gate line SGS after the voltage from the bit line BL is supplied to the memory cell MC0. In other words, at the point in time t4, the data in the memory cell MC0 can be read without being influenced by the coupling noise from the source-side select gate line SGS.

On the other hand, when the data in the memory cell connected to the word line WLi adjacent to the drain-side select gate line SGD is read, the voltage of the source-side select gate line SGS is increased after the voltage of the drain-side select gate line SGD is increased. This can prevent the voltage of the word line WLi connected to the memory cell MCi from overshooting due to the coupling noise from the drain-side select gate line SGD after the voltage from the bit line BL is supplied to the memory cell MCi. In other words, at the point in time t4, the data in the memory cell MCi can be read without being influenced by the coupling noise from the drain-side select gate line SGD.

Incidentally, in this embodiment, it can be arbitrarily set whether a data read operation is performed in the forward voltage supply order or in the backward voltage supply order when data in the memory cells MC1 to MCi-1 connected to the word lines WL1 to WLi-1 is read. For example, with the progress of microfabrication technology, it is conceivable that not only the word line WL0 adjacent to the source-side select gate line SGS but also the word line WL1 next but one to the source-side select gate line SGS is also influenced by the coupling noise from the source-side select gate line SGS. In this case, it is required to perform the read operation in the backward voltage supply order not only on the adjacent word line WL0 but also on the next-but-one word line WL1. Moreover, the read operation in the forward voltage supply order may be performed not only on the word line WLi adjacent to the drain-side select gate line SGD but also on the word line WLi-1 next but one to the drain-side select gate line SGD. In this case, the word line W1 corresponds to a third adjacent word line which is a word line adjacent to the first adjacent word line (WL0), and the word line WLi-1 corresponds to a fourth adjacent word line which is a word line adjacent to the second adjacent word line (WLi).

Further, when the data in the memory cell connected to the word line WL0 adjacent to the source-side select gate line SGS is read, it is only required to increase the voltage of the drain-side select gate line SGD after the voltage of the source-side select gate line SGS is increased, and the order of the other voltage increases can be arbitrarily changed. Similarly, when the data in the memory cell connected to the word line WLi adjacent to the drain-side select gate line SGD is read, it is only required to increase the voltage of the source-side select gate line SGS after the voltage of the drain-side select gate line SGD is increased, and the order of the other voltage increases can be arbitrarily changed.

Second Embodiment

In the aforementioned first embodiment, the case where the source-side select gate line SGS and the drain-side select gate line SGD are not respectively provided with auxiliary wires or the case where even if the auxiliary wire is provided, the influence of coupling noise from this auxiliary wire is ignored is explained, but in the second embodiment, a nonvolatile semiconductor memory device provided with the auxiliary wires on the assumption that part of word lines would be influenced by coupling noise from the auxiliary wires will be explained.

Figure 9:
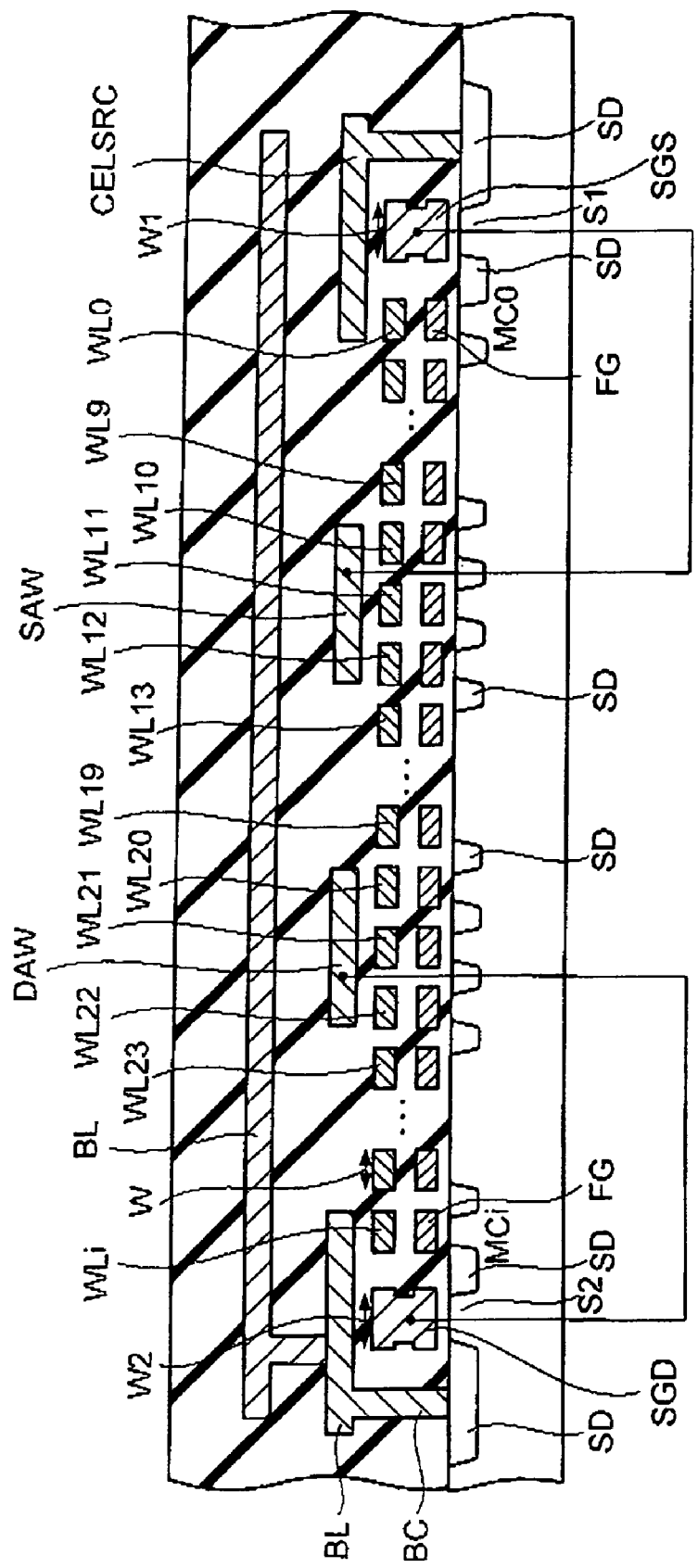
FIG. 9 is a sectional view of a NAND cell unit in a nonvolatile semiconductor memory device according to a second embodiment.

FIG. 9 is a sectional view of a NAND cell unit of the nonvolatile semiconductor memory device according to this embodiment. As shown in FIG. 9, between the source-side select transistor S1 and the drain-side select transistor S2, the memory cells MC0 to MCi which share a source/drain region SD and are connected in series are provided. The memory cells MC0 to MCi include floating gates FG and the word lines WL0 to WLi which become control gates, respectively. The source-side select transistor S1 includes the source-side select gate line SGS, and the drain-side select transistor S2 includes the drain-side select gate line SGD.

The source-side select gate line SGS is electrically connected to a source auxiliary wire SAW in a portion not shown, and the drain-side select gate line SGD is electrically connected to a drain auxiliary wire DAW in a portion not shown. The source auxiliary wire SAW corresponds to a first auxiliary wire which is electrically connected to a first select gate line (SGS) in this embodiment and under which part of the word lines are located, and the drain auxiliary wire DAW corresponds to a second auxiliary wire which is connected to a second select gate line (SGD) in this embodiment and under which part of the word lines are located.

The source-side select transistor S1 is connected to the cell source line CELSRC via the source/drain region SD. The drain-side select gate line SGD is connected to the bit line BL via the source/drain region SD and a bit line contact BC.

These auxiliary wires SAW and DAW are formed to reduce wire resistance. Accordingly, when the voltage of the source-side select gate line SGS is increased, the voltage of the source auxiliary wire SAW is also increased, and when the voltage of the drain-side select gate line SGD is increased, the voltage of the drain auxiliary wire DAW is also increased.

If the voltage of the source auxiliary wire SAW is increased, the voltages of the word lines WL10, WL11, and WL12, for example, which are provided under this source auxiliary wire SAW overshoot by receiving coupling noise from the source auxiliary wire SAW. Hence, in this embodiment, also when data in the memory cells MC10, MC11, and MC12 connected to the word line WL10, WL11, and WL12, respectively, is read, voltages are supplied to the respective select gate lines SGS and SGD, the respective word lines WL, and the bit line BL in the backward voltage supply order described in the first embodiment.

Similarly, if the voltage of the drain auxiliary wire DAW is increased, the voltages of the word lines WL20, WL21, and WL22, for example, which are provided under this drain auxiliary wire DAW overshoot by receiving coupling noise from the drain auxiliary wire DAW. Hence, in this embodiment, also when data in the memory cells MC20, MC21, and MC22 connected to the word line WL20, WL21, and WL22, respectively, is read, voltages are supplied to the respective select gate lines SGS and SGD, the respective word lines WL, and the bit line BL in the forward voltage supply order described in the first embodiment.

A more detailed explanation of these backward voltage supply order and forward voltage supply order will be given below.

Figure 10:
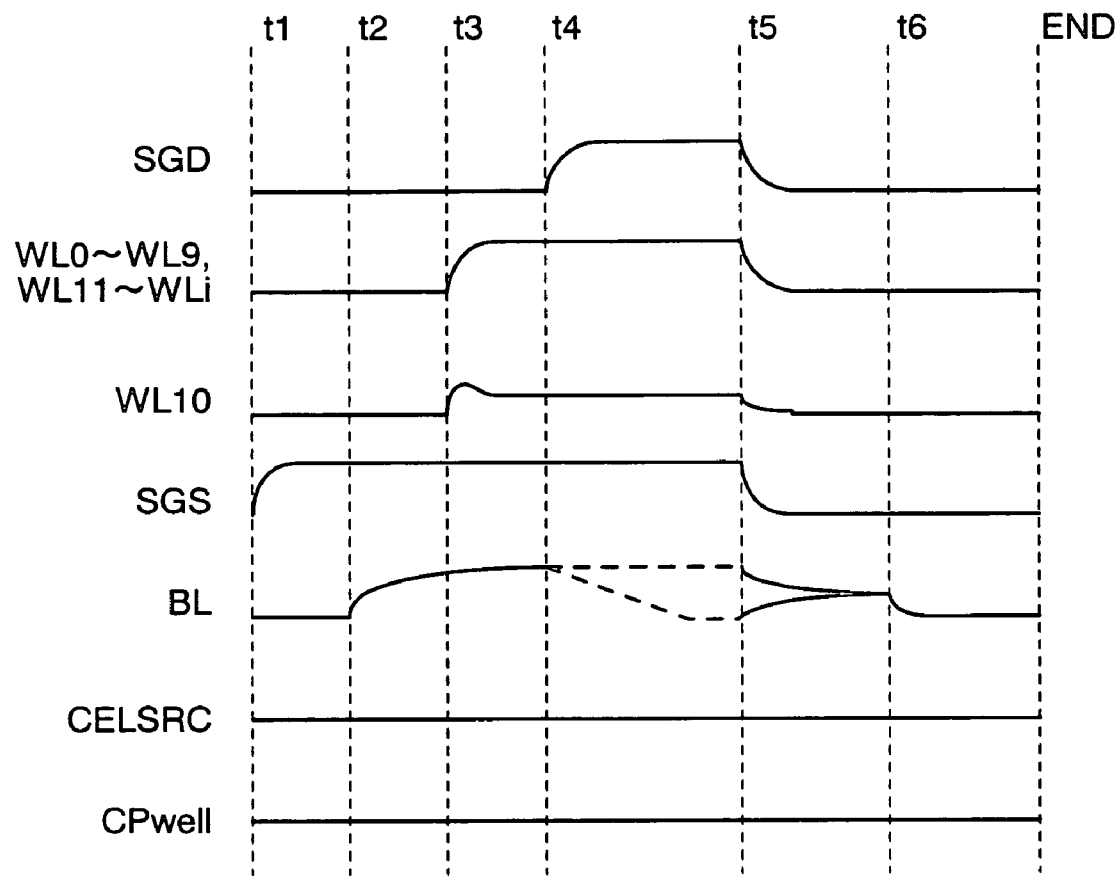
FIG. 10 is a timing chart when data in a memory cell is read in the second embodiment (when data in a memory cell connected to a word line located under an auxiliary wire of a source-side select gate line is read)

FIG. 10 is a timing chart, for example, when data in the memory cell MC 10 connected to the word line WL10 is read in the nonvolatile semiconductor memory device according to this embodiment.

As shown in FIG. 10, when the data in the memory cell MC 10 is read, first, at the point in time t1, the voltage of the source-side select gate line SGS is increased from 0 V to approximately 4 V. Subsequently, at the point in time t2, a voltage of approximately 1 V is supplied to the bit line BL. Then, at the point in time t3, predetermined voltages are supplied to the word lines WL0 to WLi. More specifically, a read voltage is supplied to the selected word line WL10 connected to the memory cell MC10 to be read, and a voltage of approximately 4 V is supplied to the non-selected word lines WL0 to WL9 and WL11 to WLi to which the other memory cells are connected. Thereafter, at the point in time t4, the voltage of the drain-side select gate line SGD is increased from 0 V to approximately 4 V. Then, the data in the memory cell is read according to whether or not the voltage of the bit line BL drops.

After this read operation is completed, at the point in time t5, the voltages of the drain-side select gate line SGD, the word lines WL0 to WLi, and the source-side select gate line SGS are discharged to 0 V, and all the bit lines BL0 to BLj are equalized in voltage. At the point in time t6, the bit lines BL0 to BLj which have become the same potential are discharged to 0 V.

Incidentally, in this embodiment, also when data in the memory cell MC0 connected to the word line WL0 is read, voltages are supplied in the same backward voltage supply order as in FIG. 10 as described in the aforementioned first embodiment.

Figure 11:
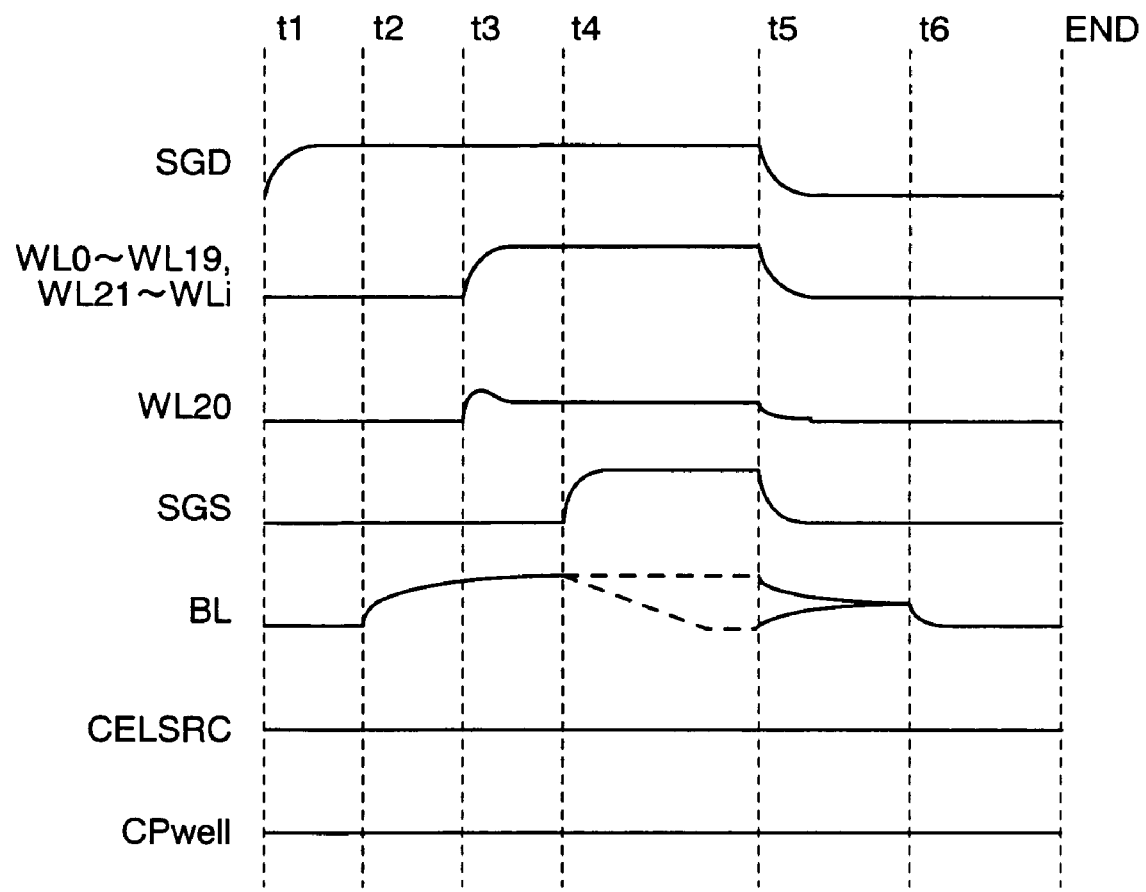
FIG. 11 is a timing chart when data in a memory cell is read in the second embodiment (when data in a memory cell connected to a word line located under an auxiliary wire of a drain-side select gate line is read)

FIG. 11 is a timing chart, for example, when data in the memory cell MC20 connected to the word line WL20 is read in the nonvolatile semiconductor memory device according to this embodiment.

As shown in FIG. 11, when the data in the memory cell MC20 is read, first, at the point in time t1, the drain-side select gate line SGD is increased from 0 V to approximately 4 V. Subsequently, at the point in time t2, the voltage of approximately 1 V is supplied to the bit line BL.

Then, at the point in time t3, the predetermined voltages are supplied to the word lines WL0 to WLi. More specifically, the read voltage is supplied to the selected word line WL20 connected to the memory cell MC20 to be read, and the voltage of approximately 4 V is supplied to the non-selected word lines WL0 to WL19, and WL21 to WLi to which the other memory cells are connected. Thereafter, at the point in time t4, the voltage of the source-side select gate SGS is increased from 0 V to approximately 4 V. Then, the data in the memory cell is read according to whether or not the voltage of the bit line BL drops.

After this read operation is completed, at the point in time t5, the voltages of the drain-side select gate line SGD, the word lines WL0 to WLi, and the source-side select gate line SGS are discharged to 0 V, and all the bit lines BL0 to BLj are equalized in voltage. At the point in time t6, the bit lines BL0 to BLj which have become the same potential are discharged to 0 V.

Incidentally, in this embodiment, also when data in the memory cell MCi connected to the word line WLi is read, voltages are supplied in the same forward voltage supply order as in FIG. 11 as described in the aforementioned first embodiment. Moreover, except for the above, the configuration is the same as in the aforementioned first embodiment.

As described above, according to the nonvolatile semiconductor memory device of this embodiment, when data in the memory cell MC connected to any of the word lines WL10, WL11, and WL12 provided under the source auxiliary wire SAW is read, the voltage of the drain-side select gate line SGD is increased after the voltage of the source-side select gate line SGS is increased. This can prevent the voltage of the word line WL10, WL11, or WL12 connected to the memory cell MC from overshooting due to the coupling noise from the source auxiliary wire SAW after the voltage from the bit line BL is supplied to the memory cell MC. In other words, at the point in time t4, the data in the memory cell MC can be read without being influenced by the coupling noise from the source auxiliary wire SAW.

On the other hand, when data in the memory cell MC connected to any of the word lines WL20, WL21, and WL22 provided under the drain auxiliary wire DAW is read, the voltage of the source-side select gate line SGS is increased after the voltage of the drain-side select gate line SGD is increased. This can prevent the voltage of the word line WL20, WL21, or WL22 connected to the memory cell MC from overshooting due to the coupling noise from the drain auxiliary wire DAW after the voltage from the bit line BL is supplied to the memory cell MC. In other words, at the point in time t4, the data in the memory cell MC can be read without being influenced by the coupling noise from the drain auxiliary wire DAW.

Incidentally, also in this embodiment, as described in the first embodiment, it can be arbitrarily set whether a data read operation is performed in the forward voltage supply order or in the backward voltage supply order when data in the memory cells MC connected to the word lines WL other than the word line WL0, the word line WLi, the word lines WL10 to WL12 provided under the source auxiliary wire SAW, and the word lines WL20 to WL22 provided under the drain auxiliary wire DAW is read. For example, as described in the first embodiment, the read operation in the backward voltage supply order may be performed not only on the word line WL0 adjacent to the source-side select gate line SGS but also on the word line WL1 next but one to the source-side select gate line SGS. Moreover, the read operation in the forward voltage supply order may be performed not only on the word line WLi adjacent to the drain-side select gate line SGD but also on the word line WLi-1 next but one to the drain-side select gate line SGD.

Incidentally, in this embodiment, it is explained that when the read operation is performed on the word lines WL10 to WL12 provided directly under the source auxiliary wire SAW, the voltages are supplied in the backward voltage supply order, but also when the read operation is performed on the word lines WL9, WL13, and so on which may receive the coupling noise from the source auxiliary wire SAW, the voltages may be supplied in the backward voltage supply order.

From the same idea, it is explained that when the read operation is performed on the word lines WL20 to WL22 provided directly under the drain auxiliary wire DAW, the voltages are supplied in the forward voltage supply order, but also when the read operation is performed on the word lines WL19, WL23, and so on which may receive the coupling noise from the drain auxiliary wire SAW, the voltages may be supplied in the forward voltage supply order.

Further, also in this embodiment, as in the aforementioned first embodiment, when data in the memory cell connected to the word line WL0 adjacent to the source-side select gate line SGS is read and when data in the memory cell MC connected to the word line WL provided under the source auxiliary wire SAW is read, it is only required to increase the voltage of the drain-side select gate line SGD after the voltage of the source-side select gate line SGS is increased, and the order of the other voltage increases can be arbitrarily changed.

Similarly, when data in the memory cell connected to the word line WLi adjacent to the drain-side select gate line SGD is read and when data in the memory cell MC connected to the word line WL provided under the drain auxiliary wire DAW is read, it is only required to increase the voltage of the source-side select gate line SGS after the voltage of the drain-side select gate line SGD is increased, and the order of the other voltage increases can be arbitrarily changed.

Third Embodiment

In the NAND-type nonvolatile semiconductor memory devices in the aforementioned first and second embodiments, in order to separate non-selected NAND cell units from the bit line BL or from the cell source line CELSRC, the select transistors S1 and S2 require a higher cutoff characteristic than the transistors constituting the memory cells MC. Therefore, as can be seen from FIG. 9, widths W1 and W2 of the select transistors S1 and S2 are formed to be wider than a width W of the word line WL.

However, if the minimum line width becomes less than 70 nm, for example, with the advance of microfabrication technology, the layout pattern comes to require periodicity, and therefore if the widths W1 and W2 of the select transistors S1 and S2 and the width W of the word line WL are greatly different, lithography becomes difficult.

Figure 12:
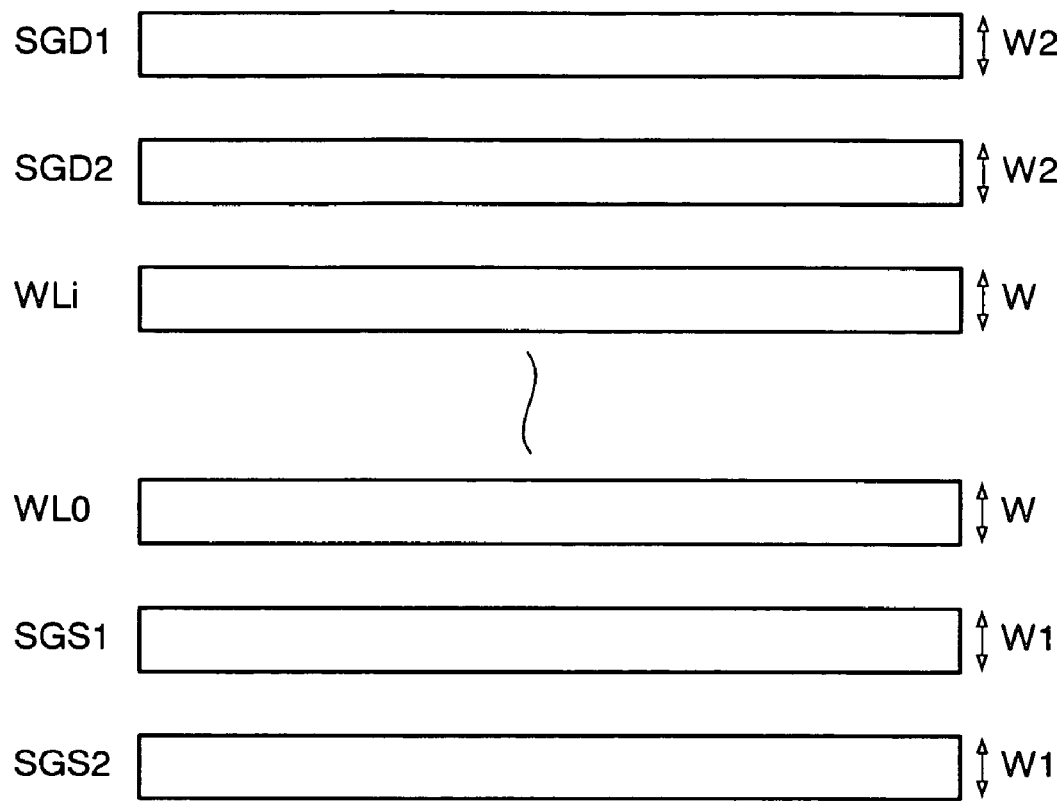
FIG. 12 is a diagram for explaining the wiring pattern and wire widths of select gate lines and word lines in a third embodiment.
Figure 13:
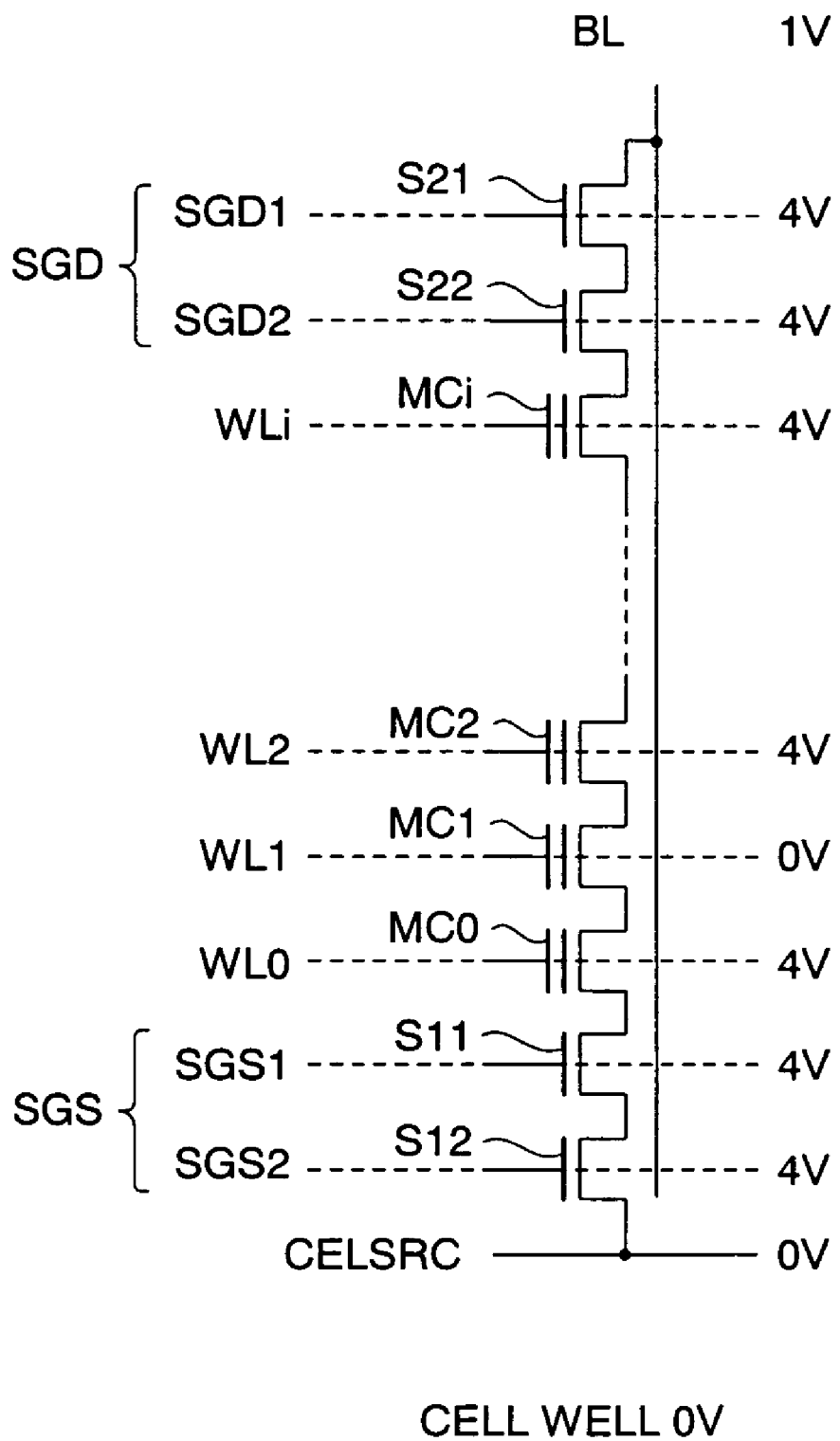
FIG. 13 is a diagram showing the configuration of one NAND cell unit in the third embodiment.

Hence, in the third embodiment, the cutoff characteristic is satisfied by making the width W of the word line WL, the width W1 of source-side select gate lines SGS1 and SGS2, and the width W2 of drain-side select gate lines SGD1 and SGD2 nearly equal and connecting two transistors in series as a select transistor as shown in FIG. 12 and FIG. 13. Incidentally, the example in FIG. 12 shows a case where the widths W1 and W2 of the select gate lines are substantially equal to the width W of the word line WL, but it is thought that if the widths W1 and W2 of the select gate lines become not more than three times (that is, one time to three times) the width W of the word line WL, the aforementioned configuration becomes preferable.

More specifically, a source-side select gate is composed of a source-side select transistor S11 whose gate-electrode is connected to the source-side select gate line SGS1 and a source-side select transistor S12 whose gate electrode is connected to the source-side select gate line SGS2. A drain-side select gate is composed of a drain-side select transistor S21 whose gate electrode is connected to the drain-side select gate line SGD1 and a drain-side select transistor S22 whose gate electrode is connected to the drain-side select gate line SGD2. In the other points, the configuration is the same as that in the aforementioned first embodiment.

Moreover, here, the source-side select gate line SGS1 corresponds to a first select gate line in this embodiment, and the source-side select gate line SGS2 corresponds to a third select gate line located on the side opposite to the first adjacent word line (WL0) with the first select gate line in this embodiment therebetween. The drain-side select gate line SGD2 corresponds to a second select gate line in this embodiment, and the drain-side select gate line SGD1 corresponds to a fourth select gate line located on the side opposite to the second adjacent word line (WLi) with the second select gate line in this embodiment therebetween.

The source-side select transistor S11 corresponds to a first select transistor in this embodiment, the source-side select transistor S12 corresponds to a third select transistor in this embodiment, the drain-side select transistor S22 corresponds to a second select transistor in this embodiment, and the drain-side select transistor S21 corresponds to a fourth select transistor in this embodiment.

Figure 14:
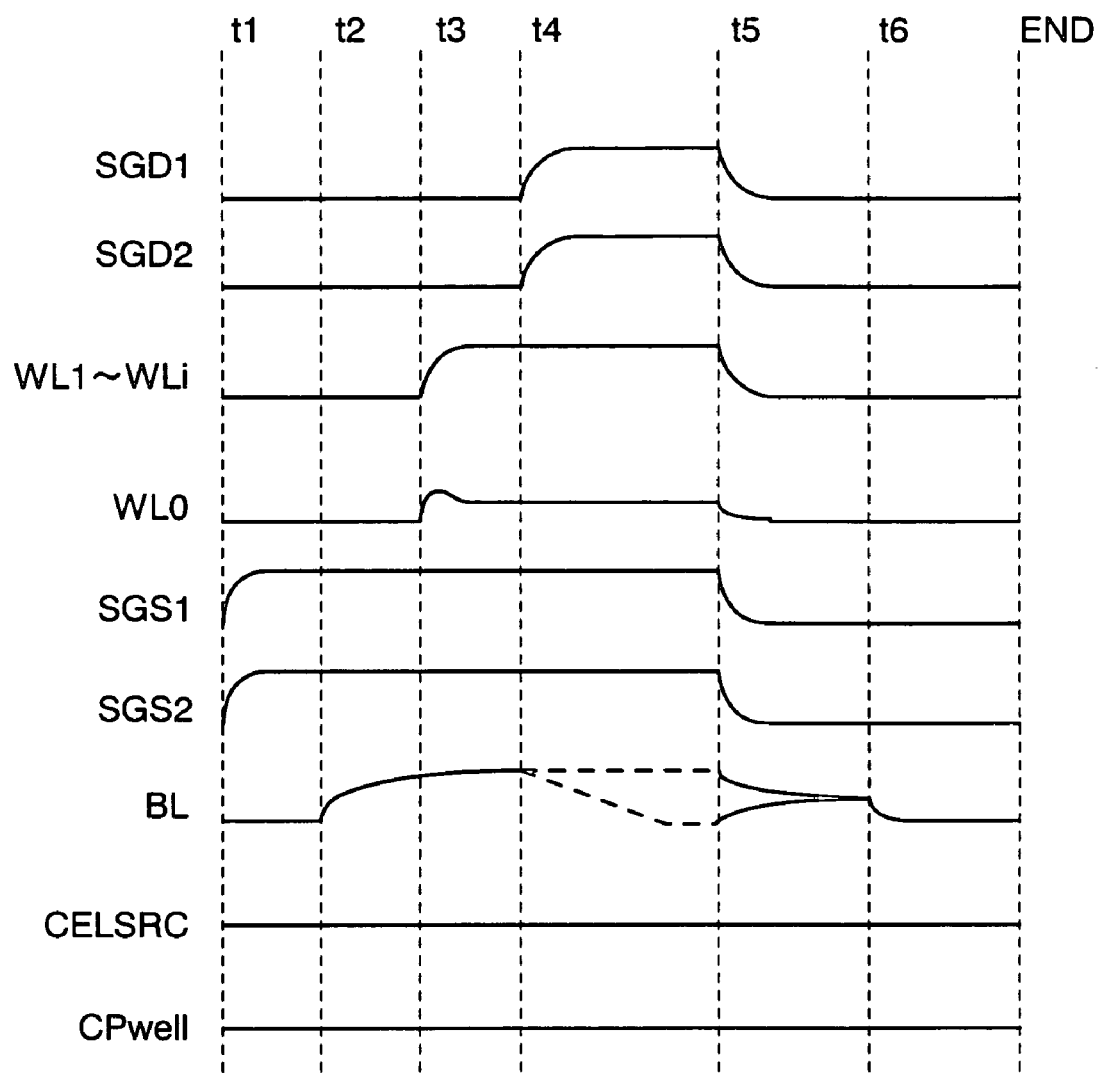
FIG. 14 is a timing chart when data in a memory cell is read in the third embodiment (when data in a memory cell connected to a word line adjacent to a source-side select gate line is read)

FIG. 14 is a timing chart when data in the memory cell MC0 connected to the word line WL0 is read in the nonvolatile semiconductor memory device according to this embodiment.

As shown in FIG. 14, when the data in the memory cell MC0 is read, first, at the point in time t1, the voltages of the source-side select gate lines SGS1 and SGS2 are increased from 0 V to approximately 4 V at the same timing. Subsequently, at the point in time t2, a voltage of approximately 1 V is supplied to the bit line BL.

Then, at the point in time t3, predetermined voltages are supplied to the word lines WL0 to WLi. More specifically, a read voltage is supplied to the selected word line WL0 connected to the memory cell MC0 to be read, and a voltage of approximately 4 V is supplied to the non-selected word lines WL1 to WLi to which the other memory cells are connected. Thereafter, at the point in time t4, the voltages of the drain-side select gate lines SGD1 and SGD2 are increased from 0 V to approximately 4 V at the same timing. Then, the data in the memory cell is read according to whether or not the voltage of the bit line BL drops.

After this read operation is completed, at the point in time t5, the voltages of the drain-side select gate lines SGD1 and SGD2, the word lines WL0 to WLi, and the source-side select gate lines SGS1 and SGS2 are discharged to 0 V, and all the bit lines BL0 to BLj are equalized in voltage. At the point in time t6, the bit lines BL0 to BLj which have become the same potential are discharged to 0 V.

Incidentally, it is defined here that the voltage supply order shown in FIG. 14 is called the backward voltage supply order.

Figure 15:
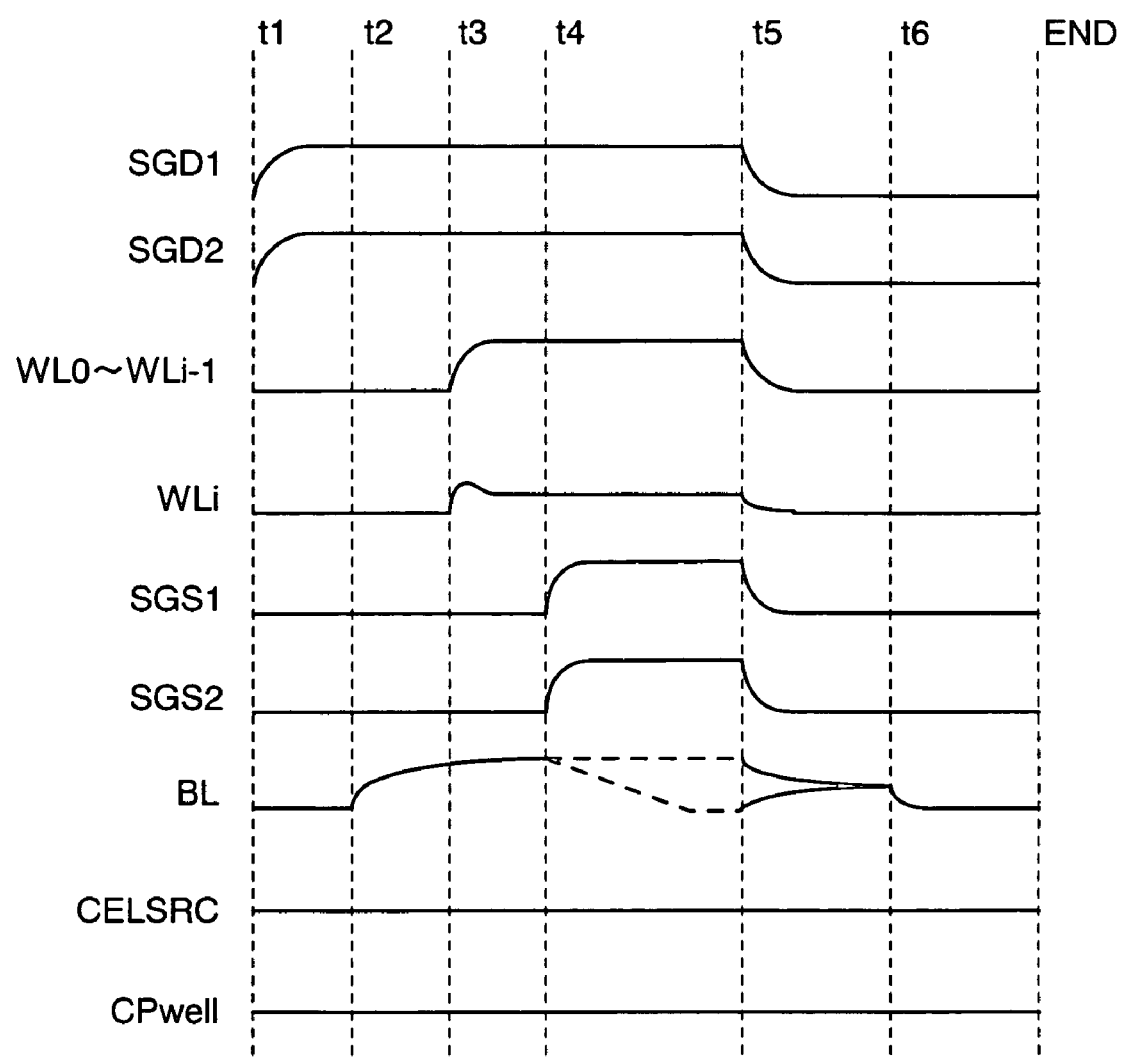
FIG. 15 is a timing chart when data in a memory cell is read in the third embodiment (when data in a memory cell connected to a word line adjacent to a drain-side select gate line is read)

FIG. 15 is a timing chart when data in the memory cell MCi connected to the word line WLi is read in the nonvolatile semiconductor memory device according to this embodiment.

As shown in FIG. 15, when the data in the memory cell MCi is read, first, at the point in time t1, the voltages of the drain-side select gate lines SGD1 and SGD2 are increased from 0 V to approximately 4 V at the same timing. Subsequently, at the point in time t2, the voltage of approximately 1 V is supplied to the bit line BL.

Then, at the point in time t3, the predetermined voltages are supplied to the word lines WL0 to WLi. More specifically, the read voltage is supplied to the selected word line WLi connected to the memory cell MCi to be read, and the voltage of approximately 4 V is supplied to the non-selected word lines WL0 to WLi-1 to which the other memory cells are connected. Thereafter, at the point in time t4, the voltages of the source-side select gate lines SGS1 and SGS2 are increased from 0 V to approximately 4 V at the same timing. Then, the data in the memory cell is read according to whether or not the voltage of the bit line BL drops.

After this read operation is completed, at the point in time t5, the voltages of the drain-side select gate lines SGD1 and SGD2, the word lines WL0 to WLi, and the source-side select gate lines SGS1 and SGS2 are discharged to 0 V, and all the bit lines BL0 to BLj are equalized in voltage. At the point in time t6, the bit lines BL0 to BLj which have become the same potential are discharged to 0 V.

Incidentally, it is defined here that the voltage supply order shown in FIG. 15 is called the forward voltage supply order.

As described above, according to the nonvolatile semiconductor memory device of this embodiment, when data in the memory cell connected to the word line WL0 adjacent to the source-side select gate line SGS1 is read, the voltages of the drain-side select gate lines SGD1 and SGD2 are increased after the voltage of the source-side select gate line SGS1 is increased. This can prevent the voltage of the word line WL0 connected to the memory cell MC0 from overshooting due to coupling noise from the source-side select gate line SGS1 after the voltage from the bit line BL is supplied to the memory cell MC0. In other words, at the point in time t4, the data in the memory cell MC0 can be read without being influenced by the coupling noise from the source-side select gate line SGS1.

On the other hand, when data in the memory cell connected to the word line WLi adjacent to the drain-side select gate line SGD2 is read, the voltages of the source-side select gate lines SGS1 and SGS2 are increased after the voltage of the drain-side select gate line SGD2 is increased. This can prevent the voltage of the word line WLi connected to the memory cell MCi from overshooting due to coupling noise from the drain-side select-gate line SGD2 after the voltage from the bit line BL is supplied to the memory cell MCi. In other words, at the point in time t4, the data in the memory cell MCi can be read without being influenced by the coupling noise from the drain-side select gate line SGD2.

Incidentally, also in this embodiment, as in the aforementioned first embodiment, it can be arbitrarily set whether a data read operation is performed in the forward voltage supply order or in the backward voltage supply order when data in the memory cells MC1 to MCi-1 connected to the word lines WL1 to WLi-1 is read.

Further, when data in the memory cell connected to the word line WL0 adjacent to the source-side select gate line SGS1 is read, it is only required to increase the voltages of the drain-side select gate lines SGD1 and SGD2 after the voltages of the source-side select gate lines SGS1 and SGS2 are increased, and the order of the other voltage increases can be arbitrarily changed. Similarly, when data in the memory cell connected to the word line WLi adjacent to the drain-side select gate line SGD2 is read, it is only required to increase the voltages of the source-side select gate lines SGS1 and SGS2 after the voltages of the drain-side select gate lines SGD1 and SGD2 are increased, and the order of the other voltage increases can be arbitrarily changed.

Fourth Embodiment

In the aforementioned third embodiment, the case where the source-side select gate lines SGS1 and SGS2 and the drain-side select gate lines SGD1 and SGD2 are not respectively provided with auxiliary wires or the case where even if the auxiliary wire is provided, the influence of coupling noise from this auxiliary wire is ignored is explained, but in the fourth embodiment, as in the aforementioned second embodiment, a nonvolatile semiconductor memory device provided with the auxiliary wires on the assumption that part of word lines would be influenced by coupling noise from the auxiliary wires will be explained.

Figure 16:
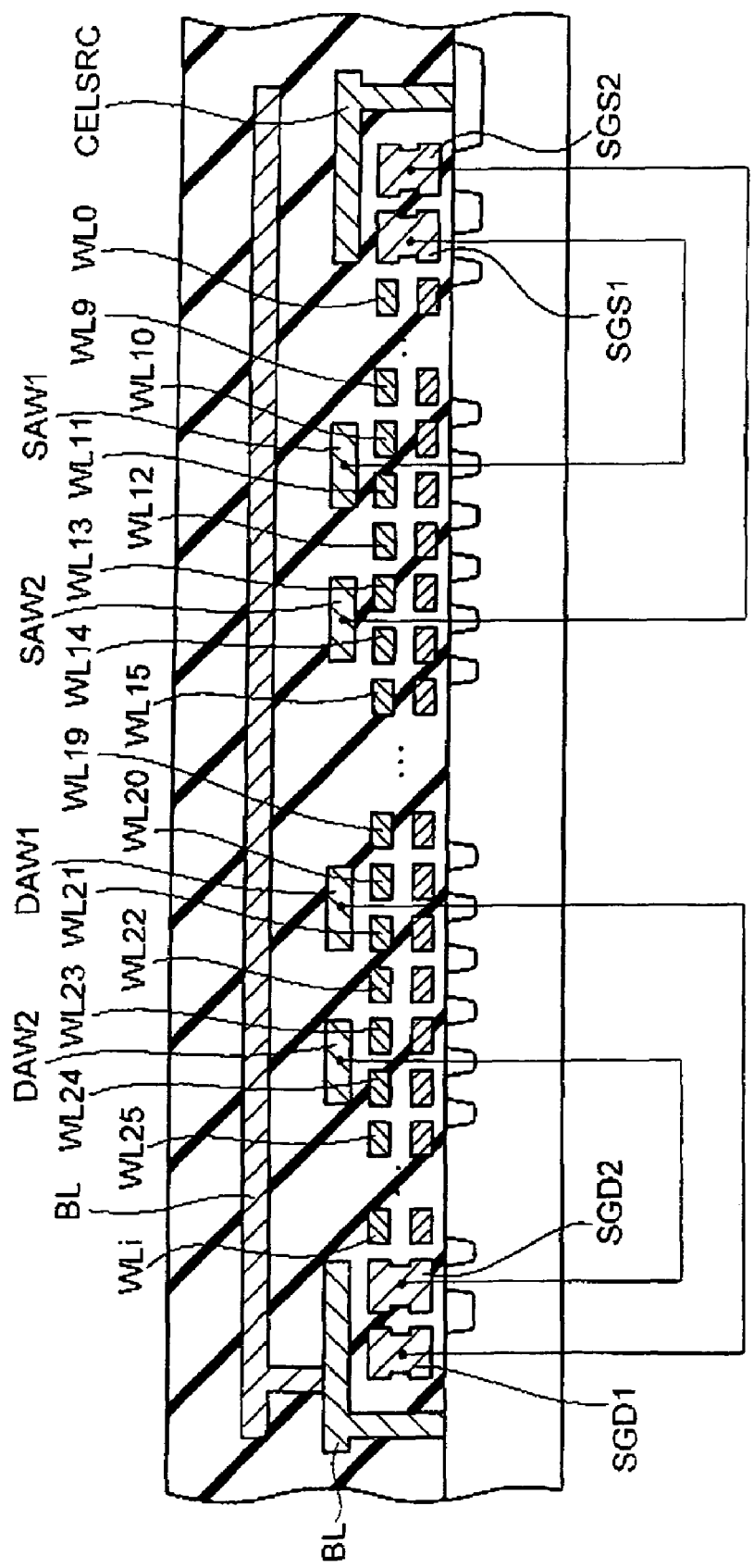
FIG. 16 is a sectional view of a NAND cell unit in a nonvolatile semiconductor memory device according to a fourth embodiment.

FIG. 16 is a sectional view of a NAND cell unit of the nonvolatile semiconductor memory device according to this embodiment. Only points different from the aforementioned second embodiment will be explained. The source-side select gate line SGS1 is electrically connected to a source auxiliary wire SAW1 in a portion not shown, and the source-side select gate line SGS2 is connected to a source auxiliary wire SAW2 in a portion not shown. The drain-side select gate line SGD1 is electrically connected to a drain auxiliary wire DAW1 in a portion not shown, and the drain-side select gate line SGD2 is electrically connected to a drain auxiliary wire DAW2 in a portion not shown. Namely, the auxiliary wires corresponding to the respective select gate lines are provided.

Incidentally, the source auxiliary wire SAW1 corresponds to a first auxiliary wire which is electrically connected to a first select gate line (SGS1) in this embodiment and under which part of the word lines are located, and the drain auxiliary wire DAW2 corresponds to a second auxiliary wire which is electrically connected to a second select gate line (SGD2) in this embodiment and under which part of the word lines are located.

The source auxiliary wire SAW2 corresponds to a third auxiliary wire which is electrically connected to a third select gate line (SGS2) in this embodiment and under which part of the word lines are located, and the drain auxiliary wire DAW1 corresponds to a fourth auxiliary wire which is electrically connected to a fourth select gate line (SGD1) in this embodiment and under which part of the word lines are located.

As in the aforementioned second embodiment, these auxiliary wires SAW1, SAW2, DAW1, and DAW2 are formed to reduce wire resistance. Accordingly, when the voltage of the source-side select gate line SGS1 is increased, the voltage of the source auxiliary wire SAW1 is also increased, and when the voltage of the source-side select gate line SGS2 is increased, the voltage of the source auxiliary wire SAW2 is also increased. When the voltage of the drain-side select gate line SGD1 is increased, the voltage of the drain auxiliary wire DAW1 is also increased, and when the voltage of the drain-side select gate line SGD2 is increased, the voltage of the auxiliary wire DAW2 is also increased If the voltage of the source auxiliary wire SAW1 is increased, the voltages of the word lines WL10 and WL11, for example, which are provided under this source auxiliary wire SAW1 overshoot by receiving coupling noise from the source auxiliary wire SAW1. Moreover, if the voltage of the source auxiliary wire SAW2 is increased, the voltages of the word lines WL13 and WL14, for example, which are provided under this source auxiliary wire SAW2 overshoot by receiving coupling noise from the source auxiliary wire SAW2.

Hence, in this embodiment, also when data in the memory cells MC connected to the word line WL10, WL11, WL13, and WL14 is read, voltages are supplied to the respective select gate lines SGS1, SGS2, SGD1, and SGD2, and word lines, and the bit line BL in the backward voltage supply order described in the third embodiment.

Similarly, if the voltage of the drain auxiliary wire DAW1 is increased, the voltages of the word lines WL20 and WL21, for example, which are provided under this drain auxiliary wire DAW1 overshoot by receiving coupling noise from the drain auxiliary wire DAW1. Moreover, if the voltage of the drain auxiliary wire DAW2 is increased, the voltages of the word lines WL23 and WL24, for example, which are provided under this drain auxiliary wire DAW2 overshoot by receiving coupling noise from the drain auxiliary wire DAW2.

Hence, in this embodiment, also when data in the memory cells MC connected to the word lines WL20, WL21, WL23 and WL24 is read, voltages are supplied to the respective gate linens and the bit line BL in the forward voltage supply order described in the third embodiment.

A more detailed explanation of these backward voltage supply order and forward voltage supply order will be given below.

Figure 17:
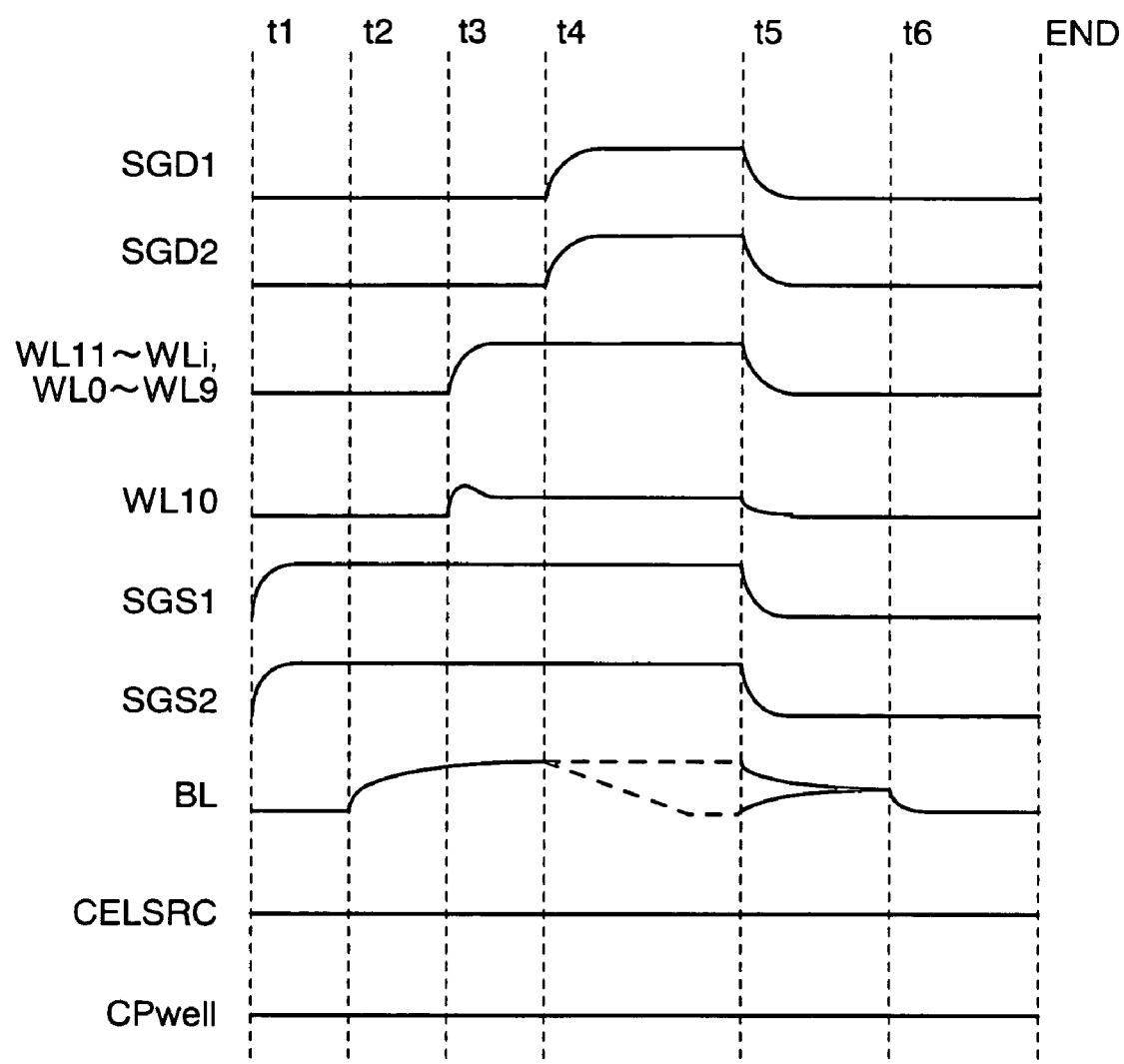
FIG. 17 is a timing chart when data in a memory cell is read in the fourth embodiment (when data in a memory cell connected to a word line located under an auxiliary wire of a source-side select gate line is read)

FIG. 17 is a timing chart, for example, when data in the memory cell MC 10 connected to the word line WL10 is read in the nonvolatile semiconductor memory device according to this embodiment.

As shown in FIG. 17, when the data in the memory cell MC 10 is read, first, at the point in time t1, the voltages of the source-side select gate lines SGS1 and SGS2 are increased from 0 V to approximately 4 V at the same timing. Subsequently, at the point in time t2, a voltage of approximately 1 V is supplied to the bit line BL.

Then, at the point in time t3, predetermined voltages are supplied to the word lines WL0 to WLi. More specifically, a read voltage is supplied to the selected word line WL10 connected to the memory cell MC10 to be read, and a voltage of approximately 4 V is supplied to the non-selected word lines WL0 to WL9 and WL11 to WLi to which the other memory cells are connected. Thereafter, at the point in time t4, the voltages of the drain-side select gate lines SGD1 and SGD2 are increased from 0 V to approximately 4 V at the same timing. Then, the data in the memory cell is read according to whether or not the voltage of the bit line BL drops.

After this read operation is completed, at the point in time t5, the voltages of the drain-side select gate lines SGD1 and SGD2, the word lines WL0 to WLi, and the source-side select gate lines SGS1 and SGS2 are discharged to 0 V, and all the bit lines BL0 to BLj are equalized in voltage. At the point in time t6, the bit lines BL0 to BLj which have become the same potential are discharged to 0 V.

Incidentally, in this embodiment, also when data in the memory cell MC0 connected to the word line WL0 is read, voltages are supplied in the same backward voltage supply order as in FIG. 17 as described in the aforementioned third embodiment.

Figure 18:
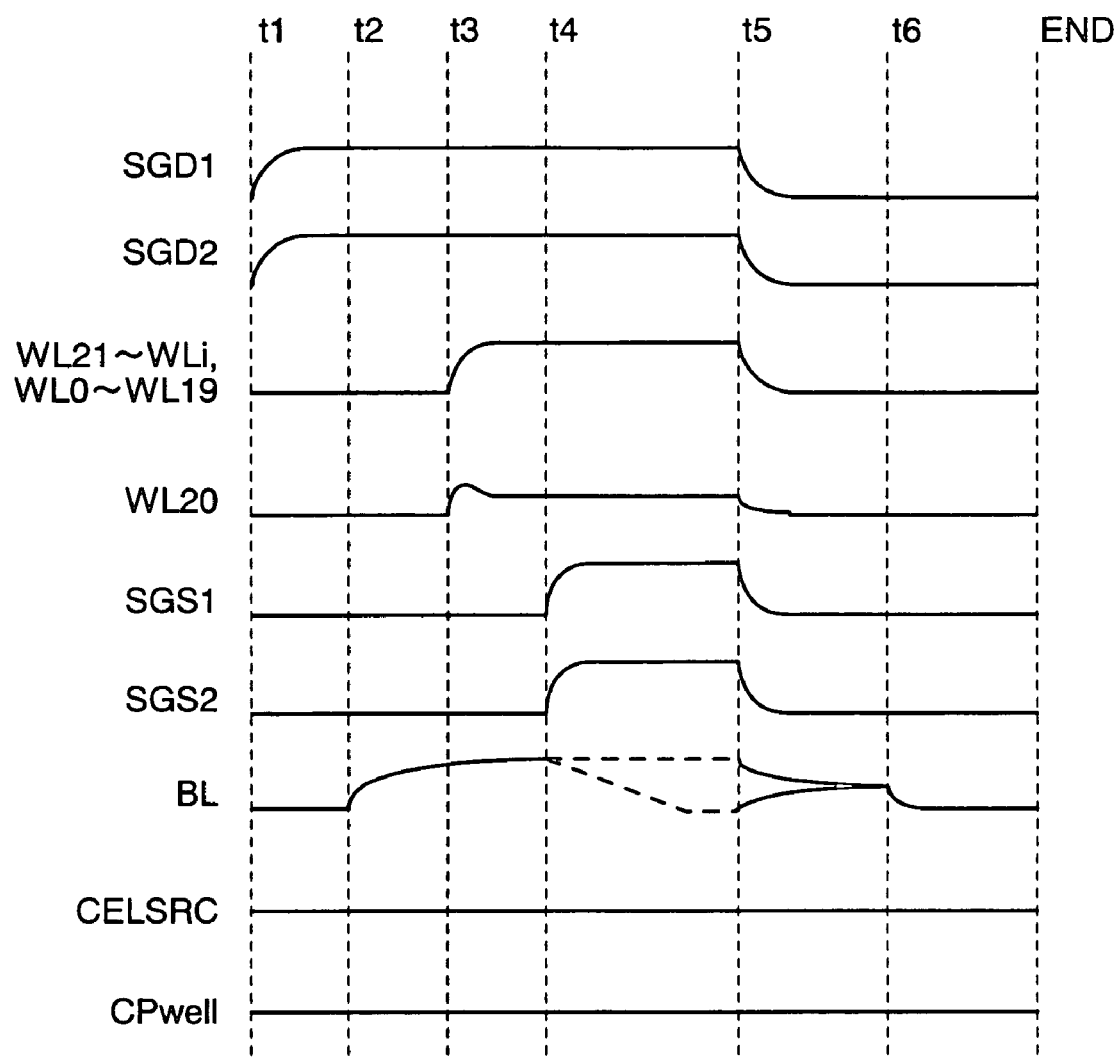
FIG. 18 is a timing chart when data in a memory cell is read in the fourth embodiment (when data in a memory cell connected to a word line located under an auxiliary wire of a drain-side select gate line is read)

FIG. 18 is a timing chart, for example, when data in the memory cell MC20 connected to the word line WL20 is read in the nonvolatile semiconductor memory device according to this embodiment.

As shown in FIG. 18, when the data in the memory cell MC20 is read, first, at the point in time t1, the drain-side select gate lines SGD1 and SGD2 are increased from 0 V to approximately 4 V at the same timing. Subsequently, at the point in time t2, the voltage of approximately 1 V is supplied to the bit line BL.

Then, at the point in time t3, the predetermined voltages are supplied to the word lines WL0 to WLi. More specifically, the read voltage is supplied to the selected word line WL20 connected to the memory cell MC20 to be read, and the voltage of approximately 4 V is supplied to the non-selected word lines WL0 to WL19, and WL21 to WLi to which the other memory cells are connected. Thereafter, at the point in time t4, the voltages of the source-side select gate lines SGS1 and SGS2 are increased from 0 V to approximately 4 V at the same timing. Then, the data in the memory cell is read according to whether or not the voltage of the bit line BL drops.

After this read operation is completed, at the point in time t5, the voltages of the drain-side select gate lines SGD1 and SGD2, the word lines WL0 to WLi, and the source-side select gate lines SGS1 and SGS2 are discharged to 0 V, and all the bit lines BL0 to BLj are equalized in voltage. At the point in time t6, the bit lines BL0 to BLj which have become the same potential are discharged to 0 V.

Incidentally, in this embodiment, also when data in the memory cell MCi connected to the word line WLi is read, voltages are supplied in the same forward voltage supply order as in FIG. 18 as described in the aforementioned third embodiment. Moreover, except for the above, the configuration is the same as in the aforementioned third embodiment.

As described above, according to the nonvolatile semiconductor memory device of this embodiment, when data in the memory cell MC connected to any of the word lines WL10, WL11, WL13 and WL14 provided under the source auxiliary wires SAW1 and SAW2 is read, the voltages of the drain-side select gate lines SGD1 and SGD2 are increased after the voltages of the source-side select gate lines SGS1 and SGS2 are increased. This can prevent the voltage of the word line WL10, WL11, WL13 or WL14 connected to the memory cell MC from overshooting due to the coupling noise from the source auxiliary wire SAW1 or SAW2 after the voltage from the bit line BL is supplied to the memory cell MC. In other words, at the point in time t4, the data in the memory cell MC can be read without being influenced by the coupling noise from the source auxiliary wire SAW1 or SAW2.

On the other hand, when data in the memory cell MC connected to any of the word lines WL20, WL21, WL23, and WL24 provided under the drain auxiliary wires DAW1 and DAW2 is read, the voltages of the source-side select gate lines SGS1 and SGS2 are increased after the voltages of the drain-side select gate lines SGD1 and SGD2 are increased. This can prevent the voltage of the word line WL20, WL21, WL23, or WL24 connected to the memory cell MC from overshooting due to the coupling noise from the drain auxiliary wire DAW1 or DAW2 after the voltage from the bit line BL is supplied to the memory cell MC. In other words, at the point in time t4, the data in the memory cell MC can be read without being influenced by the coupling noise from the drain auxiliary wire DAW1 or DAW2.

Incidentally, also in this embodiment, it can be arbitrarily set whether a data read operation is performed in the forward voltage supply order or in the backward voltage supply order when data in the memory cells MC connected to the word lines WL other than the word line WL0, the word line WLi, the word lines WL10, WL11, WL13, and WL14 provided under the source auxiliary wires SAW1 and SAW2, and the word lines WL20, WL21, WL23, and WL24 provided under the drain auxiliary wires DAW1 and DAW2 is read. For example, as described in the third embodiment, the read operation in the backward voltage supply order may be performed not only on the word line WL0 adjacent to the source-side select gate line SGS1 but also on the word line L1 next but one to the source-side select gate line SGS1. Moreover, the read operation in the forward voltage supply order may be performed not only on the word line WLi adjacent to the drain-side select gate line SGD2 but also on the word line WLi-1 next but one to the drain-side select gate line SGD2.

Incidentally, in this embodiment, it is explained that when the read operation is performed on the word lines WL10, WL11, WL13, and WL14 provided directly under the source auxiliary wires SAW1 and SAW2, the voltages are supplied in the backward voltage supply order, but also when the read operation is performed on the word lines WL9, WL12, and WL15 which may receive the coupling noise from the source auxiliary wires SAW1 and SAW2, the voltages may be supplied in the backward voltage supply order.

From the same idea, although, in this embodiment, it is explained that when the read operation is performed on the word lines WL20, WL21, WL23, and WL24 provided directly under the drain auxiliary wires DAW1 and DAW2, the voltages are supplied in the forward voltage supply order, also when the read operation is performed on the word lines WL19, WL22, and WL25 which may receive the coupling noise from the drain auxiliary wires SAW1 and SAW2, the voltages may be supplied in the forward voltage supply order.

Further, also in this embodiment, as in the aforementioned third embodiment, when data in the memory cell connected to the word line WL0 adjacent to the source-side select gate line SGS1 is read and when data in the memory cell MC connected to the word line WL provided under the source auxiliary wire SAW1 or SAW2 is read, it is only required to increase the voltages of the drain-side select gate lines SGD1 and SGD2 after the voltages of the source-side select gate lines SGS1 and SGS2 are increased, and the order of the other voltage increases can be arbitrarily changed.

Similarly, when data in the memory cell MC connected to the word line WLi adjacent to the drain-side select gate line SGD2 is read and when the data in the memory cell MC connected to the word line WL provided under the drain auxiliary wire DAW1 or DAW2 is read, it is only required to increase the voltages of the source-side select gate lines SGS1 and SGS2 after the voltages of the drain-side select gate line SGD1 and SGD2 are increased, and the order of the other voltage increases can be arbitrarily changed.

Fifth Embodiment

The fifth embodiment is a modification of the aforementioned third embodiment, and in a read operation, even where data in a memory cell connected to any of the word lines WL is read, voltages are supplied in the aforementioned forward voltage supply order, but voltages are supplied to the source-side select gate line SGS1 and the source-side select gate line SGS2 at different timings, that is, a voltage is first supplied to the source-side select gate line SGS1 and thereafter a voltage is supplied to the source-side select gate line SGS2. Except for this point, the configuration is the same as that in the aforementioned third embodiment.

Incidentally, in this embodiment, the source-side select gate line SGS1 in FIG. 13 corresponds to a first select gate line, the source-side select gate line SGS2 corresponds to a second select gate line located on the side opposite to the first adjacent word line (WL0) with the first select gate line in this embodiment therebetween. The drain-side select gate line SGD2 corresponds to a third select gate line adjacent to the second adjacent word line (WLi) which is a word line located on the side opposite to the first adjacent word line. The drain-side select gate line SGD1 corresponds to a fourth select gate line located on the side opposite to the second adjacent word line (Wli) with the third select gate line in this embodiment therebetween.

The source-side select transistor S11 corresponds to a first select transistor in this embodiment, the source-side select transistor S12 corresponds to a second select transistor in this embodiment, the drain-side select transistor S22 corresponds to a third select transistor in this embodiment, and the drain-side select transistor S21 corresponds to a fourth select transistor in this embodiment.

Figure 19:
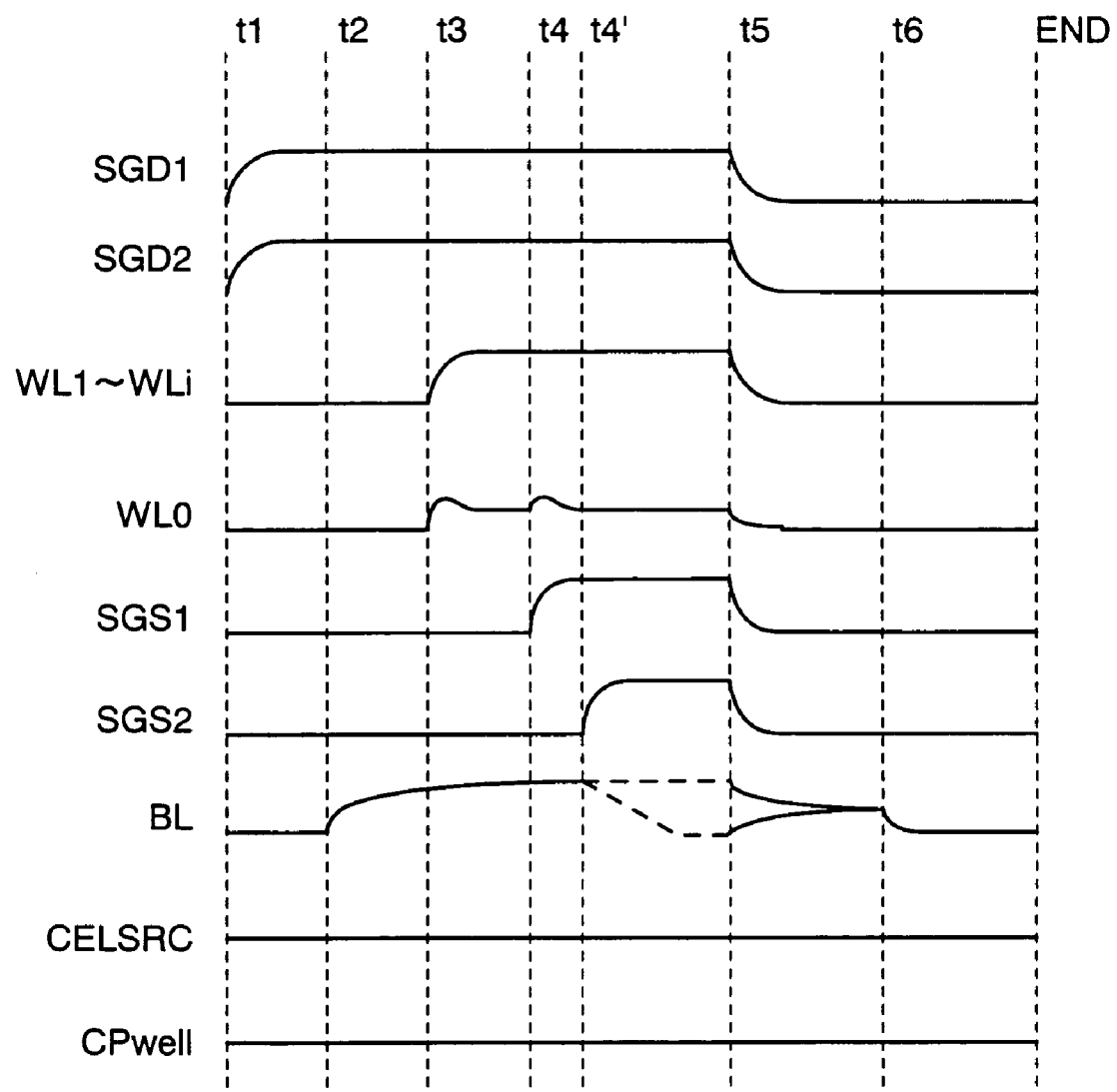
FIG. 19 is a timing chart when data in a memory cell is read in a fifth embodiment.

FIG. 19 is a timing chart when data in the memory cell MC0 connected to the word line W0 is read in a nonvolatile semiconductor memory device according to this embodiment. Incidentally, also when data in the memory cells MC connected to the word lines WL1 to WLi other than this word line, voltages are supplied in the same voltage supply order as in FIG. 19.

As shown in FIG. 19, when the data in the memory cell MC0 is read, first, at the point in time t1, the voltages of the drain-side select gate lines SGD1 and SGD2 are increased from 0 V to approximately 4 V at the same timing. Subsequently, at the point in time t2, a voltage of approximately 1 V is supplied to the bit line BL.

Then, at the point in time t3, predetermined voltages are supplied to the word lines WL0 to WLi. More specifically, a read voltage is supplied to the selected word line WL0 connected to the memory cell MC0 be read, and a voltage of approximately 4 V is supplied to the non-selected word lines WL1 to WLi to which the other memory cells are connected. Thereafter, at the point in time t4, the voltage of the source-side select gate line SGS1 is increased from 0 V to approximately 4 V. Then, at a point in time t4', the voltage of the source-side select gate line SGS2 is increased from 0 V to approximately 4 V. Subsequently, the data in the memory cell is read according to whether or not the voltage of the bit line BL drops.

After this read operation is completed, at the point in time t5, the voltages of the drain-side select gate lines SGD1 and SGD2, the word lines WL0 to WLi, and the source-side select gate lines SGS1 and SGS2 are discharged to 0 V, and all the bit lines BL0 to BLj are equalized in voltage. At the point in time t6, the bit lines BL0 to BLj which have become the same potential are discharged to 0 V.

Incidentally, it is defined here that the voltage supply order shown in FIG. 19 is called the forward voltage supply order.

As described above, according to the nonvolatile semiconductor memory device of this embodiment, the read operation is performed in the forward voltage supply order, and after the voltage of the source-side select gate line SGS1 adjacent to the word line WL0 is increased, the voltage of the source-side select gate line SGS2 located outside the source-side select gate line SGS1 is increased. Hence, even if the voltage of the source-side select gate line SGS2 is increased at the point in time t4', coupling noise to the word line WL0 can be reduced to a minimum.

Namely, at the point in time t4, the voltage of the source-side select gate line SGS1 is increased from 0 V to approximately 4 V, and at this time, the voltage of the word line WL0 overshoots due to coupling noise from the source-side select gate line SGS1. However, since the voltage of the source-side select gate line SGS2 remains 0 V, the source-side select gate transistor S12 is in a cutoff state, and therefore, discharge from the bit line BL is not started even in the case of the memory cell to which the voltage of the bit line BL is to be discharged. Accordingly, it is possible to wait until the overshoot of the voltage of the word line WL0 is restored, and after the word line WL becomes a desired read voltage, the read operation (bit line discharge) can be performed.

Figure 20:
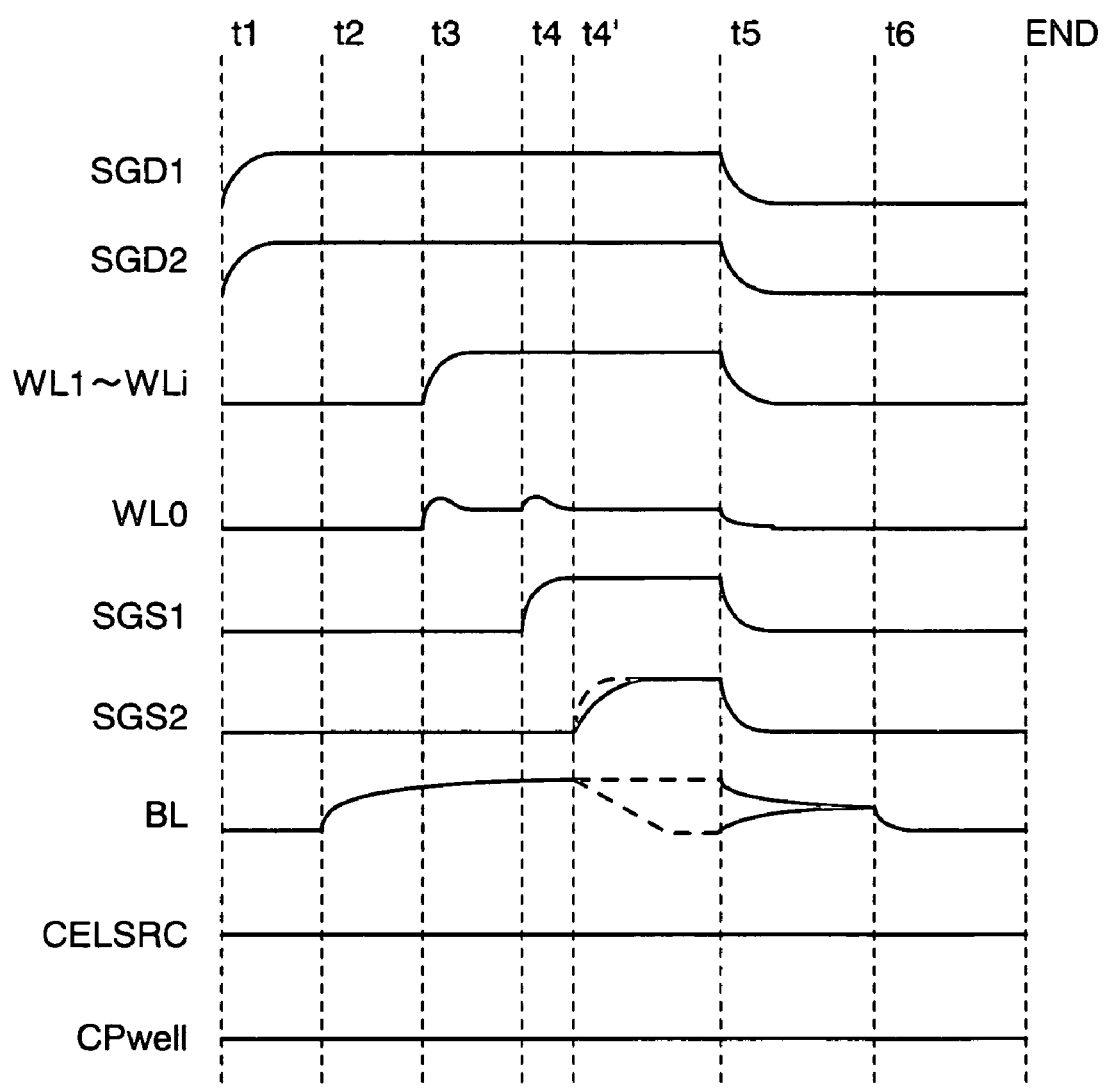
FIG. 20 is a timing chart showing a modification of the timing chart in FIG. 19.
Figure 21:
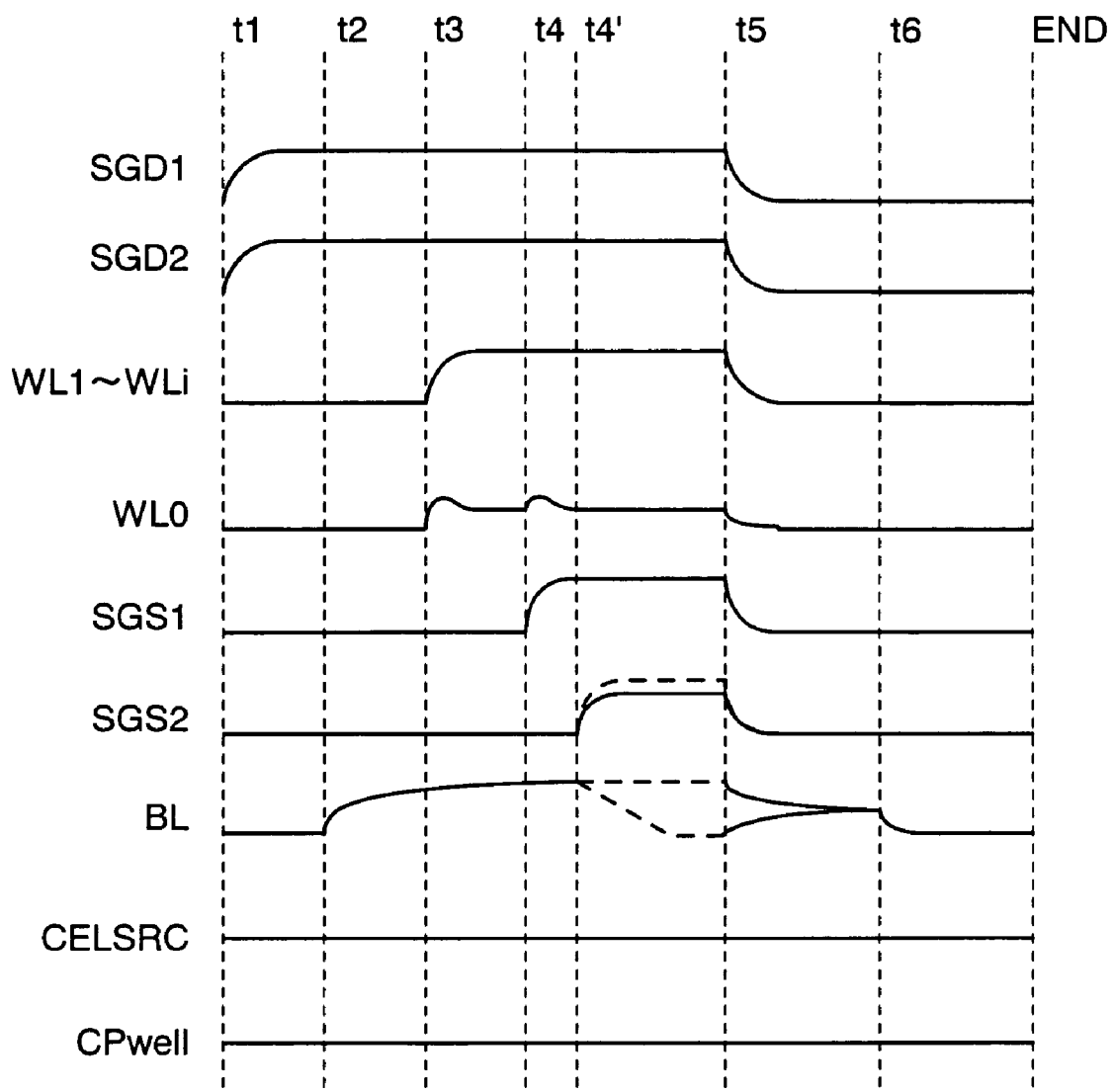
FIG. 21 is a timing chart showing another modification of the timing chart in FIG. 19.
Figure 22:
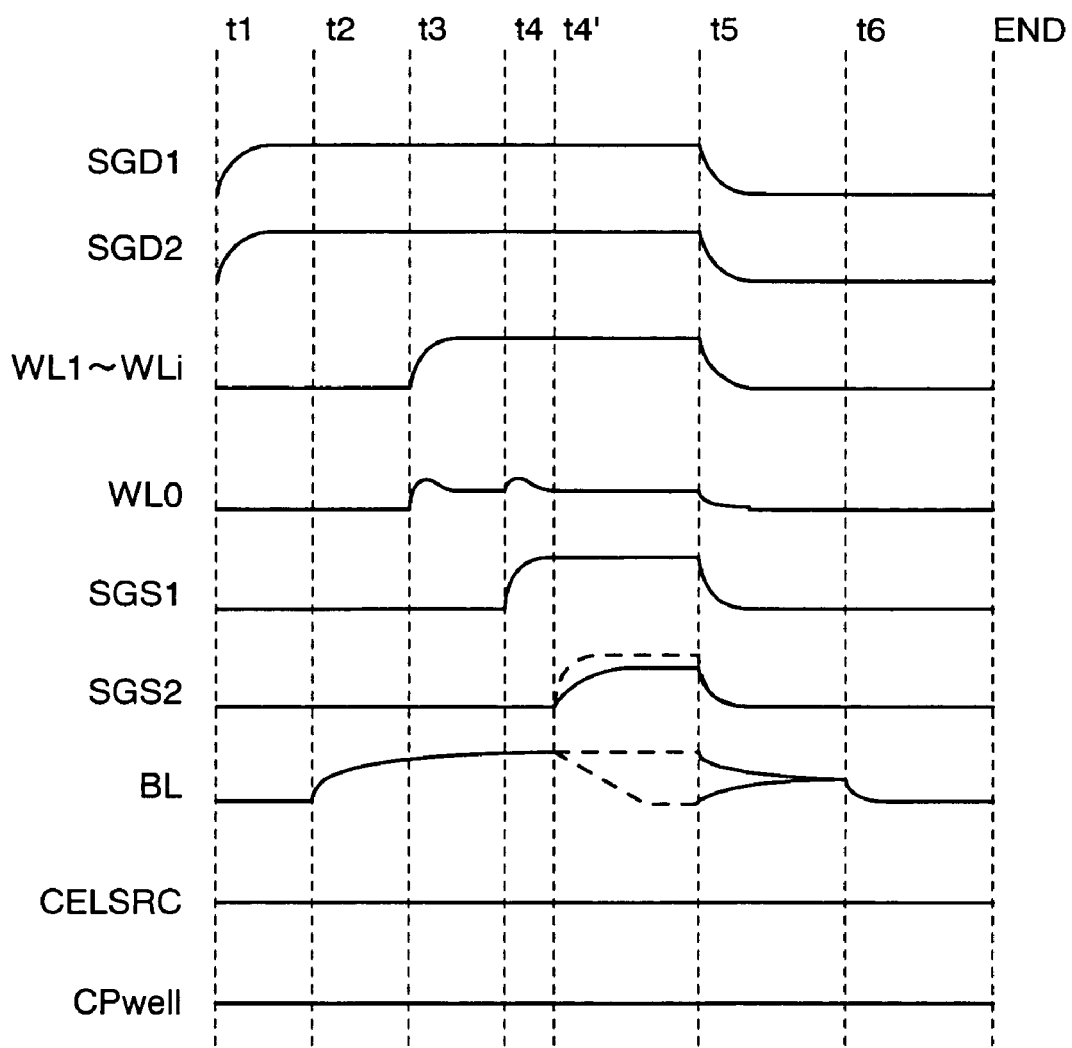
FIG. 22 is a timing chart showing still another modification of the timing chart in FIG. 19.

In this embodiment, as shown in FIG. 20, the voltage increase speed of the source-side select gate line SGS2 may be slower than the voltage increase speed of the source-side select gate SGS1. Further, as shown in FIG. 21, the voltage supplied to the source-side select gate line SGS2 may be lower than the voltage supplied to the source-side select gate line SGS1. Furthermore, as shown in FIG. 22, the voltage increase speed of the source-side select gate line SGS2 may be slower than the voltage increase speed of the source-side select gate line SGS1 and the voltage supplied to the source-side select gate line SGS2 may be lower than the voltage supplied to the source-side select gate line SGS1. In so doing, the influence of coupling noise on the word line WL0 from the source-side select gate line SGS2 can be further reduced.

It should be mentioned that the present invention is not limited to the aforementioned embodiments, and various changes may be made therein. For example, in the aforementioned third to fifth embodiments, the case where the number of source-side select transistors is two and the number of drain-side select transistors is also two is explained, but the number of these select transistors may be any number and may be three or four. Further, the numbers of source-side select transistors and drain-side select transistors may be different.

Figure 23:
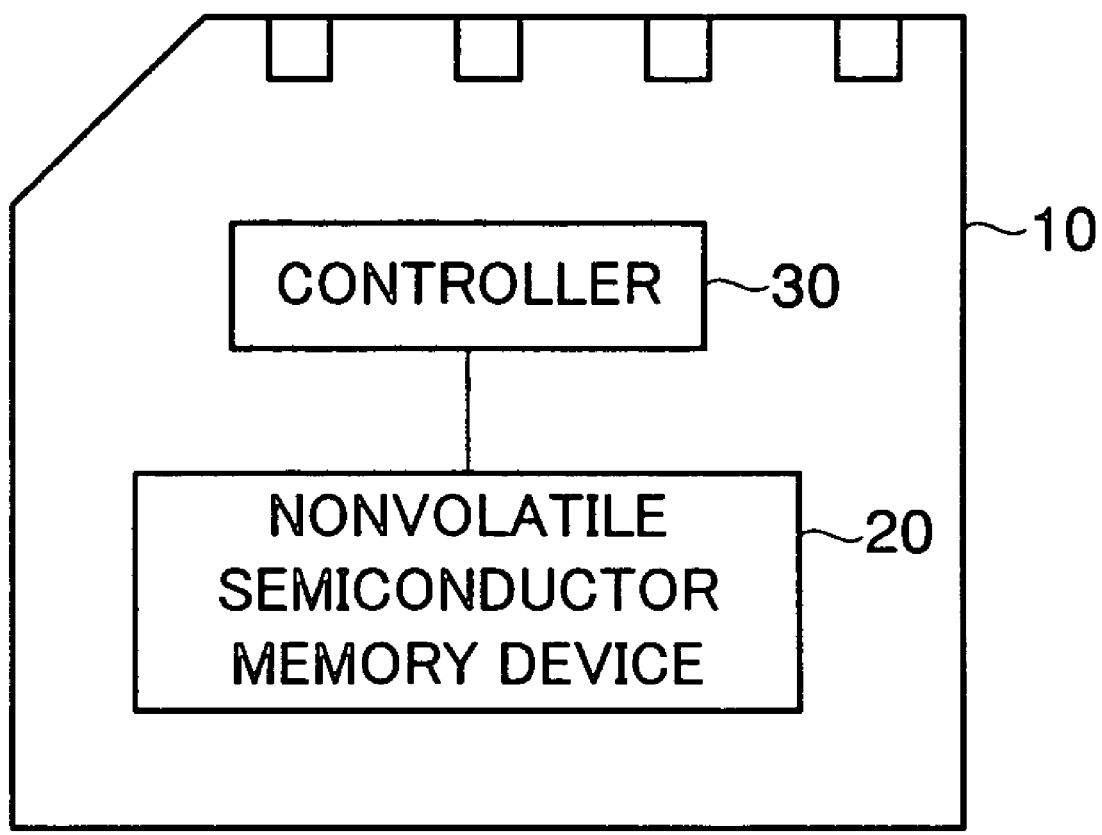
FIG. 23 is a block diagram showing the configuration of a memory card equipped with a nonvolatile semiconductor memory device in each of the embodiments.

Moreover, the nonvolatile semiconductor memory devices according to the aforementioned first embodiment to fifth embodiment can be mounted in a memory card 10 as shown in FIG. 23. Namely, a nonvolatile semiconductor memory device 20 and a controller 30 which controls the nonvolatile semiconductor memory device 20 can be mounted to compose the memory card 10.

Additionally, the aforementioned embodiments are explained with the nonvolatile semiconductor memory device as an example, but the present invention is also applicable to other types of semiconductor memory devices including plural word lines and select gate lines.

What is claimed is:

1. A semiconductor memory device, comprising:
   a first select gate line which is provided along a first direction, a gate electrode of a first select transistor being connected to the first select gate line;
   a second select gate line which is provided along the first direction, a gate electrode of a second select transistor being connected to the second select gate line; and
   a plurality of word lines which are provided between the first select gate line and the second select gate line along the first direction, gate electrodes of memory cells being respectively connected to the word lines, wherein when data in a memory cell connected to a first adjacent word line which is a word line adjacent to the first select gate line is read, voltages of the word lines are increased after a voltage of the first select gate line is increased and a voltage of the second select gate line is increased after the voltages of the word lines are increased, and when data in a memory cell connected to a second adjacent word line which is a word line adjacent to the second select gate line is read, the voltages of the word lines are increased after the voltage of the second gate line is increased and a voltage of the first select gate line is increased after the voltages of the word lines are increased.

2. The semiconductor memory device according to claim 1, wherein when data in a memory cell connected to a third adjacent word line which is a word line adjacent to the first adjacent word line is read, the voltage of the second select gate line is increased after the voltage of the first select gate line is increased, and when data in a memory cell connected to a fourth adjacent word line which is a word line adjacent to the second adjacent word line is read, the voltage of the first select gate line is increased after the voltage of the second select gate line is increased.

3. The semiconductor memory device according to claim 1, further comprising:
   a first auxiliary wire which is electrically connected to the first select gate line, a part of the word lines being located under the first auxiliary wire; and
   a second auxiliary wire which is electrically connected to the second select gate line, a part of the word lines being located under the second auxiliary wire, wherein
   when data in a memory cell connected to a word line provided under the first auxiliary wire is read, the voltage of the second select gate line is increased after the voltage of the first select gate line is increased, and when data in a memory cell connected to a word line provided under the second auxiliary wire is read, the voltage of the first select gate line is increased after the voltage of the second select gate line is increased.

4. The semiconductor memory device according to claim 3, wherein when data in a memory cell connected to a third adjacent word line which is a word line adjacent to the first adjacent word line is read, the voltage of the second select gate line is increased after the voltage of the first select gate line is increased, and when data in a memory cell connected to a fourth adjacent word line which is a word line adjacent to the second adjacent word line is read, the voltage of the first select gate line is increased after the voltage of the second select gate line is increased.

5. The semiconductor memory device according to claim 1, wherein
   the memory cells arranged in a second direction which is a direction crossing the first direction are connected in series while sharing a source/drain region to compose a NAND cell unit, and
   the NAND cell unit is connected to a cell source line via the first select transistor and connected to a bit line via the second select transistor.

6. The semiconductor memory device according to claim 1, further comprising:
   a third select gate line which is provided along the first direction, a gate electrode of a third select transistor being connected to the third select gate line, the third select gate line being located on a side opposite to the first adjacent word line with the first select gate line therebetween; and
   a fourth select gate line which is provided along the first direction a gate electrode of a fourth select transistor being connected to the fourth select line, the fourth select gate line being located on a side opposite to the second adjacent word line with the second select gate line therebetween, wherein
   when the data in the memory cell connected to the first adjacent word line is read, a voltage of the fourth select gate line is increased after a voltage of the third select gate line is increased, and when the data in the memory cell connected to the second adjacent word line is read, the voltage of the third select gate line is increased after the voltage of the fourth select gate line is increased.

7. The semiconductor memory device according to claim 6, wherein when the data in the memory cell connected to the word line is read, the voltages of the first select gate line and the third select gate line are increased at the same timing and the voltages of the second select gate line and the fourth select gate line are increased at the same timing.

8. The semiconductor memory device according to claim 6, further comprising:
   a first auxiliary wire which is electrically connected to the first select gate line, a part of the word lines being located under the first auxiliary wire;
   a second auxiliary wire which is electrically connected to the second select gate line, a part of the word line being located under the second auxiliary wire;
   a third auxiliary wire which is electrically connected to the third select gate line, a part of the word lines being located under the third auxiliary wire; and
   a fourth auxiliary wire which is electrically connected to the fourth select gate line, a part of the word lines being located under the fourth auxiliary wire, wherein
   when data in a memory cell connected to a word line provided under the first auxiliary wire or the third auxiliary wire is read, the voltages of the second select gate line and the fourth select gate line are increased after the voltages of the first select gate line and the third select gate line are increased, and when data in a memory cell connected to a word line provided under the second auxiliary wire or the fourth auxiliary wire is read, the voltages of the first select gate line and the third select gate line are increased after the voltages of the second select gate line and the fourth select gate line are increased.

9. The semiconductor memory device according to claim 8, wherein when the data in the memory cell connected to the word line is read, the voltages of the first select gate line and the third select gate line are increased at the same timing, and the voltages of the second select gate line and the fourth select gate line are increased at the same timing.

10. The semiconductor memory device according to claim 6, wherein widths of the first to fourth select gate lines are not more than three times a width of the word line.

11. The semiconductor memory device according to claim 6, wherein widths of the first to fourth select gate lines and a width of the word line are substantially equal.

12. The semiconductor memory device according to claim 6, wherein the memory cells arranged in a second direction which is a direction crossing the first direction are connected in series while sharing a source/drain region to compose a NAND cell unit, and the NAND cell unit is connected to a cell source line via the first select transistor and the third select transistor and connected to a bit line via the second select transistor and the fourth select transistor.

13. The semiconductor memory device according to claim 1, further comprising a bit line which is connected to the second select transistor, wherein a voltage of the bit line is increased after the voltage of the first select gate line is increased and before the voltages of the word lines are increased, when data in a memory cell connected to the first adjacent word line is read, and wherein the voltage of the bit line is increased after the voltage of the second select gate line is increased and before the voltages of the word lines are increased, when data in a memory cell connected to the second adjacent word line is read.

14. A semiconductor memory device, comprising:

a plurality of word lines which are provided along a first direction gate electrodes of memory cells being respectively connected to the word lines;

a first select gate line which is provided along the first direction, a gate electrode of a first select transistor being connected to the first select gate line;

a second select gate line which is provided along the first direction, a gate electrode of a second select transistor being connected to the second select gate line, and the second select gate line being located across the first select gate line from a first adjacent word line which is a word line adjacent to the first select gate line;

a third select gate line which is provided along the first direction, a gate electrode of a third select transistor being connected to the third select gate line, and the third select gate line being adjacent to a second adjacent word line which is a word line located on a side opposite to the first adjacent word line; and a fourth select gate line which is provided adjacent to the third select gate line along the first direction, a gate electrode of a fourth select transistor being connected to the fourth select gate line, and the fourth select gate line being located across the third select gate line from the second adjacent word line, wherein when data in a memory cell is read, the voltage of the first select gate line is increased after voltages of the third select gate line and the fourth select gate line are increased, and thereafter the voltage of the second select gate line is increased, and the semiconductor memory device further comprises a bit line which is connected to the fourth select transistor, wherein a voltage of the bit line is increased after the voltages of the third select gate line and the fourth select gate line are increased and before the voltages of the word lines are increased, when data in a memory cell connected to the first adjacent word line is read, and wherein the voltage of the bit line is increased after the voltages of the first select gate line and the second select gate line are increased and before the voltages of the word lines are increased, when data in a memory cell connected to the second adjacent word line is read.

15. The semiconductor memory device according to claim 14, wherein a voltage increase speed of the second select gate line is slower than a voltage increase speed of the first select gate line.

16. The semiconductor memory device according to claim 14, wherein a voltage supplied to the second select gate line is lower than a voltage supplied to the first select gate line.

17. The semiconductor memory device according to claim 14, wherein a voltage increase speed of the second select gate line is slower than a voltage increase speed of the first select gate line, and a voltage supplied to the second select gate line is lower than a voltage supplied to the first select gate line.

18. A memory card including a semiconductor memory device, wherein the semiconductor memory device comprises:

a first select gate line which is provided along a first direction, a gate electrode of a first select transistor being connected to the first select gate;

a second select gate line which is provided along the first direction, a gate electrode of a second select transistor being connected to second select gate; and a plurality of word lines which are provided between the first select gate line and the second select gate line along the first direction, gate electrodes of memory cells being respectively connected to the word lines, wherein when data in a memory cell connected to a first adjacent word line which is a word line adjacent to the first select gate line is read, voltages of the word lines are increased after a voltage of the first select gate line is increased and a voltage of the second select word line is increased after the voltages of the word lines are increased, and when data in a memory cell connected to a second adjacent word line which is a word line adjacent to the second select gate line is read, voltages of the word lines are increased after the voltage of the second gate line is increased and a voltage of the first select word line is increased after the voltages of the word lines are increased.

19. A memory card including a semiconductor memory device, wherein the semiconductor memory device comprises:

a plurality of word lines which are provided along a first direction, gate electrodes of memory cells being respectively connected to the word lines;

a first select gate line which is provided along the first direction, a gate electrode of a first select transistor being connected to the first select gate line;

a second select gate line which is provided along the first direction, a gate electrode of a second select transistor being connected to the second select gate line, and the second select gate line is located across the first select gate line from a first adjacent select gate line which is a word line adjacent to the first select gate line;

a third select gate line which is provided along the first direction, a gate electrode of a third select transistor being connected to the third select gate line, and the third select gate line being adjacent to a second adjacent word line which is a word line located on a side opposite to the first adjacent word line; and a fourth select gate line which is provided adjacent to the third select gate line along the first direction, a gate electrode of a fourth select transistor being connected to the fourth select gate line, and the fourth select gate line being located across the third select gate line from the second adjacent word line, wherein when data in a memory cell is read, the voltage of the first select gate line is increased after voltages of the third select gate line and the fourth select gate line are increased, and thereafter the voltage of the second select gate line is increased, and the semiconductor memory device further comprises a bit line which is connected to the fourth select transistor, wherein a voltage of the bit line is increased after the voltages of the third select gate line and the fourth select gate line are increased and before the voltages of the word lines are increased, when data in a memory cell connected to the first adjacent word line is read, and wherein the voltage of the bit line is increased after the voltages of the first select gate line and the second select gate line are increased and before the voltages of the word lines are increased, when data in a memory cell connected to the second adjacent word line is read.

* * * * *